(12) United States Patent
Yamazaki et al.

(10) Patent No.: US 8,546,912 B2
(45) Date of Patent: Oct. 1, 2013

(54) SEMICONDUCTOR DEVICE

(75) Inventors: Shunpei Yamazaki, Setagaya (JP); Tatsuya Arao, Ebina (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/440,157

(22) Filed: Apr. 5, 2012

(65) Prior Publication Data

US 2012/0187457 A1 Jul. 26, 2012

Related U.S. Application Data

(63) Continuation of application No. 10/583,365, filed as application No. PCT/JP2005/004589 on Mar. 9, 2005, now Pat. No. 8,159,043.

(30) Foreign Application Priority Data

Mar. 12, 2004 (JP) ................................. 2004-070788

(51) Int. Cl.
*H01L 21/08* (2006.01)

(52) U.S. Cl.
USPC ......................................................... 257/531

(58) Field of Classification Search
USPC ......................................................... 257/531
See application file for complete search history.

(56) References Cited

U.S. PATENT DOCUMENTS

| 4,481,526 | A | 11/1984 | Miyasaka |
| 5,497,140 | A | 3/1996 | Tuttle |
| 5,604,360 | A | 2/1997 | Zhang et al. |
| 6,013,949 | A | 1/2000 | Tuttle |
| 6,045,652 | A | 4/2000 | Tuttle et al. |
| 6,133,835 | A | 10/2000 | De Leeuw et al. |
| 6,312,795 | B1 | 11/2001 | Yamamoto |

(Continued)

FOREIGN PATENT DOCUMENTS

| JP | 10-135040 A | 5/1998 |
| JP | 2000-090637 | 3/2000 |

(Continued)

OTHER PUBLICATIONS

International Search Report (Application No. PCT/JP2005/004589) dated Jun. 28, 2005.

(Continued)

*Primary Examiner* — Bradley K Smith
(74) *Attorney, Agent, or Firm* — Eric J. Robinson; Robinson Intellectual Property Law Office, P.C.

(57) ABSTRACT

A semiconductor device such as an ID chip of the present invention includes an integrated circuit using a semiconductor element formed by using a thin semiconductor film, and an antenna connected to the integrated circuit. It is preferable that the antenna is formed integrally with the integrated circuit, since the mechanical strength of an ID chip can be enhanced. Note that the antenna used in the present invention also includes a conducting wire that is wound round circularly or spirally and fine particles of a soft magnetic material are arranged between the conducting wires. Specifically, an insulating layer in which fine particles of a soft magnetic material are arranged between the conducting wires. Specifically, an insulating layer in which fine particles of a soft magnetic material are included is arranged between the conducting wires.

16 Claims, 17 Drawing Sheets

(56) References Cited

U.S. PATENT DOCUMENTS

| | | |
|---|---|---|
| 6,326,922 B1 | 12/2001 | Hegendoerfer |
| 6,509,217 B1 * | 1/2003 | Reddy ........................ 438/153 |
| 8,159,043 B2 * | 4/2012 | Yamazaki et al. ............ 257/531 |
| 2001/0007335 A1 | 7/2001 | Tuttle et al. |
| 2001/0038127 A1 * | 11/2001 | Yamazaki et al. ............ 257/359 |
| 2001/0045593 A1 | 11/2001 | De Leeuw et al. |
| 2002/0105058 A1 | 8/2002 | Tuttle |
| 2002/0146893 A1 | 10/2002 | Shimoda et al. |
| 2003/0016133 A1 | 1/2003 | Egbert |
| 2003/0022694 A1 | 1/2003 | Olsen et al. |
| 2003/0116790 A1 | 6/2003 | Kikuchi et al. |
| 2003/0234294 A1 | 12/2003 | Uchihiro et al. |
| 2005/0140539 A1 * | 6/2005 | Fujieda et al. .................... 342/1 |

FOREIGN PATENT DOCUMENTS

| | | |
|---|---|---|
| JP | 2000-323656 A | 11/2000 |
| JP | 2002-169858 | 6/2002 |
| JP | 2003-078023 | 3/2003 |
| WO | WO 01/99193 | 12/2001 |

OTHER PUBLICATIONS

Written Opinion (Application No. PCT/JP2005/004589) dated Jun. 28, 2005.

Fukuda et al, *Planar Inductors with Ferrite Layers for DC-DC Converter*, Kawasaki Seitetsu Gihou, vol. 34, No. 3, 125-128, 2002.

Office Action (Application No. 200580007958.2) dated Jan. 4, 2008.

* cited by examiner 574   571   572   573   570

575

SEMICONDUCTOR DEVICE

TECHNICAL FIELD

The present invention relates to a semiconductor device that can conduct wireless communication.

BACKGROUND ART

A semiconductor device such as an ID chip that can transmit and receive data such as identification information wirelessly has been coming into practical use in various areas, and the expansion of its market is further anticipated as a communication information terminal of a new mode. An ID chip is called also a wireless tag, a RFID (Radio frequency identification) tag or an IC tag, and one having an antenna and an integrated circuit formed by using a semiconductor substrate is coming into practical use at present.

DISCLOSURE OF INVENTION

The category of ID chips includes an ID chip formed by connecting an integrated circuit and an antenna, which have been formed separately, and an ID chip formed by sequentially (integrally) forming an integrated circuit and an antenna on the same substrate.

As for the ID chip formed by connecting an integrated circuit and an antenna, which have been formed separately, defects are easily caused in the connection portion of the integrated circuit and the antenna, and thus it is difficult to increase the process yield. Further, an ID chip is expected to be attached to a flexible material such as paper or plastic depending on its application. For the reason, a stress is applied, in some cases, to a substrate where an integrated circuit is formed in the use thereof, even though the integrated circuit is favorably connected to an antenna. Thus, there is a problem that defects are caused easily by the stress and thus, the reliability is low.

On the other hand, in an ID chip where an integrated circuit and an antenna are formed integrally, such a detect in a connection portion is not easily caused, different from one where an integrated circuit and an antenna are formed separately. However, the area for forming an antenna is naturally limited if the number of ID chips formed from one substrate is to be secured. Thus, it is difficult to enlarge the size of an antenna and to form a high gain antenna.

A semiconductor substrate used for forming an integrated circuit is generally poor in flexibility and mechanical strength, which is a drawback. However, the mechanical strength can be enhanced to some extent by reducing the area of an integrated circuit itself. However, the case is not favorable, since securing a circuit scale is difficult and the use of an ID chip is limited. Therefore, it is not favorable that the area of an integrated circuit is randomly reduced when securing the circuit scale of the integrated circuit is considered to be important.

The present invention has been made in view of the above described problems. It is an object of the present invention to provide an ID chip in which gain of an antenna is increased and the mechanical strength of an integrated circuit can be enhanced without suppressing a circuit scale. Further, the present invention relates to a packing material, a tag, a certificate, a bank note, a portfolio and the like using the ID chip.

A semiconductor device of the present invention comprises a radio frequency chip, the radio frequency chip further comprises an ID chip. The semiconductor device includes an integrated circuit using a semiconductor element formed by using a thin semiconductor film, and an antenna connected to the integrated circuit. It is preferable that the antenna is formed integrally with the integrated circuit, since the mechanical strength of the semiconductor device can be enhanced. Note that the antenna used in the present invention also includes a conducting wire that is wound round circularly or spirally and fine particles of a soft magnetic material are arranged between the conducting wires. Specifically, an insulating layer in which fine particles of a soft magnetic material are included (dispersed) is arranged between the conducting wires.

According to the present invention, an insulating film may be formed to cover conducting wires and an insulating layer in which fine particles of a soft magnetic material are included (dispersed) may be arranged between the conducting wires to sandwich the insulating film.

Further, the insulating layer may be formed to cover the conducting wires according to the present invention.

Note that an integrated circuit and an antenna may be formed directly over a substrate, or may be formed over a substrate, then separated therefrom, and attached to another substrate that is prepared separately. The attachment of an integrated circuit may, for example, be carried out according to various kinds of methods as follows: a metal oxide film is formed between a high heat resistant substrate and an integrated circuit, and the metal oxide film is crystallized and weakened to separate the integrated circuit, thereby attaching it to an object; a separation layer is provided between a high heat resistant substrate and an integrated circuit, the separation layer is removed by laser irradiation or by etching to separate the integrated circuit from the substrate, thereby attaching it to an object; and a high heat resistant substrate over which an integrated circuit is formed is mechanically removed or is removed by etching using a solution or a gas to separate the integrated circuit from the substrate, thereby attaching it to an object.

Integrated circuits, which are formed separately, may be attached to one another to stack the integrated circuits such that the scale of the circuits or the memory capacity may be increased. Since the integrated circuits are dramatically thin in thickness as compared with an ID chip manufactured using a semiconductor substrate, the mechanical strength of an ID chip can be maintained to some extent even when the plural integrated circuits are stacked. The stacked integrated circuits can be connected to one another by using a known connection method such as a flip chip method, a TAB (tape automated bonding) method or a wire bonding method.

The category of the present invention includes a packing material, a tag, a certificate, a bank note, a portfolio and the like using the ID chip. Packing materials are equivalent to a support medium, such as a wrap, a plastic bottle, a tray and a capsule, which can be shaped or has been shaped to wrap up an object. Tags according to the present invention correspond to tags such as a luggage tag, a price tag, or a name tag having information of the object attached with a tag. Certificates according to the present invention correspond to a document for certificating facts such as a family register, a residency card, a passport, a license, an identification card, a membership card, a credit card, a cash card, a prepaid card, a consultation card, or a commuter ticket. Portfolios according to the present invention correspond to portfolios to certificates that show property rights in private law such as bills, checks, carriage notes, cargo certificates, warehouse certificates, stock certificates, bond certificates, gift certificates and deeds of mortgage.

The soft magnetic material is a magnetic material that has high permeability and small coercitivity. Therefore, it is preferable that the soft magnetic material is arranged between conducting wires, and generation of eddy current in a conductor of the conducting wires, due to a magnetic flux that intersects with a plane including an antenna, would be suppressed. Accordingly, it is preferable that the loss of the magnetic flux that intersects with a plane including an antenna is suppressed, and the mutual inductance of the antenna would be increased. It is preferable that the gain of the antenna would be increased while securing the mechanical strength of the ID chip.

An insulating film including a soft magnetic material is formed to cover the conductive wires. Thus, it is preferable to prevent the magnetic flux which is generated in the antenna from being lost by the conductors arranged in the vicinity of the conducting wires. Specifically, when a conductor is used for a surface of an object to which an ID chip is attached, the ID chip is attached such that an insulating layer including a soft magnetic material is arranged between the antenna and the surface. At this time, it is preferable to prevent the loss of magnetic flux due to the conductor.

A wiring for connecting an integrated circuit and an antenna can be formed over the substrate in the process of manufacturing the integrated circuit, by forming the integrated circuit and the antenna integrally. Therefore, generation of connection failure in forming an ID chip can be reduced. Further, when a flexible substrate is used, a connection failure due to application of stress to a substrate can be also reduced and thus the reliability is enhanced.

A flexible substrate can be used since an integrated circuit is formed by using a semiconductor element formed from a thin semiconductor film. It is preferable to obtain the high mechanical strength without reducing the area, different from an integrated circuit using a semiconductor substrate. Therefore, it is preferable to enhance the mechanical strength of an integrated circuit without reducing the circuit scale and to enlarge the application range of an ID chip.

BEST MODE FOR CARRYING OUT THE INVENTION

Embodiment Modes according to the present invention will hereinafter be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment modes given below.

Figure 1A:
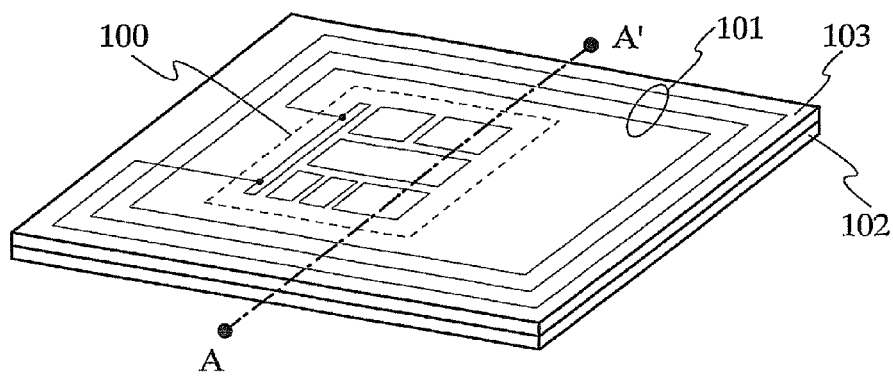
FIG. 1A is a perspective view and FIGS. 1B and 1C are each a cross-sectional view of an ID chip according to one aspect of the present invention.
Figure 1B:
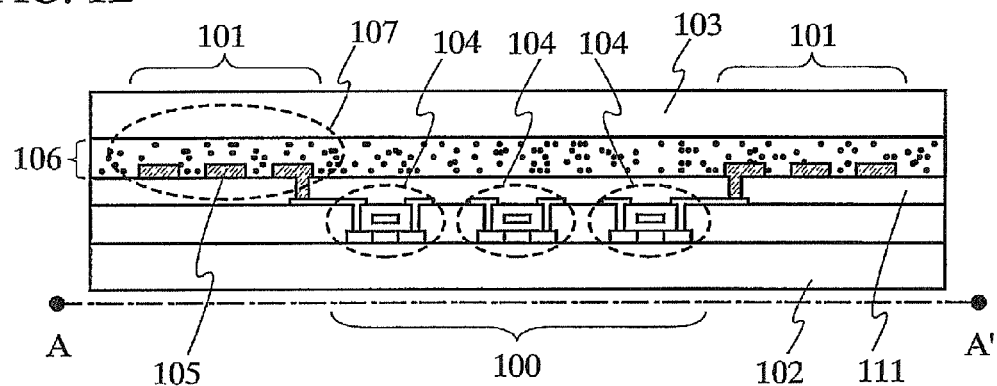

A structure of a semiconductor device such as an ID chip according to the present invention will be described with reference to FIGS. 1A to 1C. FIG. 1A is a perspective view of one mode of the ID chip of the present invention and FIG. 1B is a cross sectional view of a line A-A' from FIG. 1A. Reference numeral 100 denotes an integrated circuit and reference numeral 101 denotes an antenna. The antenna 101 is electrically connected to the integrated circuit 100. Reference numeral 102 denotes a substrate and reference numeral 103 denotes a cover material. The integrated circuit 100 and the antenna 101 are sandwiched between the substrate 102 and the cover material 103.

Note that, in FIG. 1B, a TFT (thin film transistor) 104 is shown as an example of a semiconductor element included in the integrated circuit 100. The semiconductor element used for the integrated circuit 100 is not limited to a TFT. In addition to a TFT, for example, a memory element, a diode, a photoelectric conversion element, a resistor element, a coil, a capacitor element, an inductor and the like can be employed. The antenna 101 is formed on an interlayer insulating film 111 covering the TFT.

As for the ID chip of the present invention, an insulating layer 106 is formed between conducting wires 105 constituting a part of the antenna 101. Further, an insulating layer 106 may be formed not only between the conducting wires 105 but also over the conducting wire 105 as shown in FIG. 1B according to the present invention.

Figure 1C:
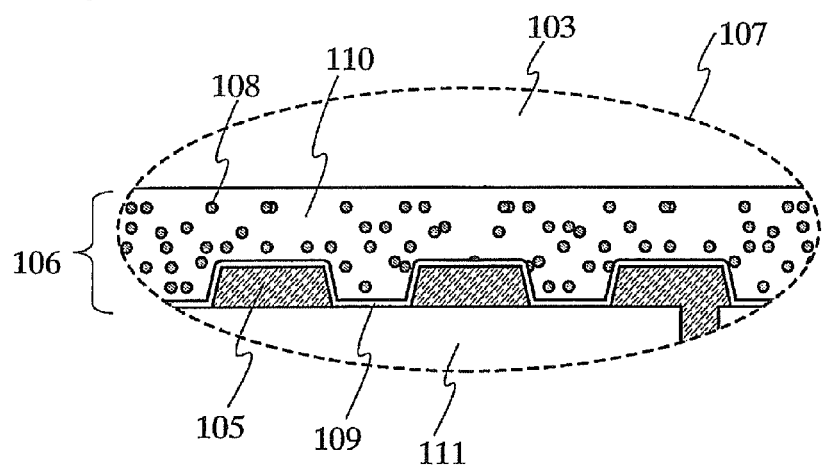

Next, FIG. 1C is an enlarged view showing a part of an ID chip, surrounded by the broken line 107 in FIG. 1B. A material in which fine particles 108 of a soft magnetic material are dispersed is used for the insulating layer 106. Organic resin such as polyimide, epoxy, acryl or polyamide can be used for the insulator 110. Besides the organic resin, an inorganic resin such as a resin containing Si—O—Si bond (hereinafter, referred to as a siloxane resin) or the like can be used. Siloxane has a skeleton structure with a bond of silicon (Si) and oxygen (O). As a substituent thereof, an organic group including at least hydrogen (such as alkyl group or aromatic hydrocarbon) is used. Further, a fluoro group may be used for the substituent. Also, an organic group including at least hydrogen and a fluoro group may be used for the substituent.

Inorganic insulating films such as silicon oxide, silicon nitride oxide or silicon nitride can be used as the insulator 110 as long as a soft magnetic material can be contained therein.

As the soft magnetic material used for the fine particles 108, for example, Fe, Co, Ni, or an alloy including some of them, in addition, $3Y_2O_3 \cdot 5Fe_2O_3$ (YIG), $Fe_2O_3$, Fe—Si—Al alloy, Fe—Cr alloy, FeP alloy, or a permalloy in which Ni or Ni—Fe alloy is added with one or some of Mo, Cu, Cr, and Nb can be also used. In addition, a soft ferrite typified by Mn—Zn ferrite can be employed as the soft magnetic material.

As shown in FIG. 1C, in the ID chip of the present invention, an insulating film 109 (hereinafter, an isolation insulating film) for electrically isolating the conducting wires 105 may be formed between the insulating layer 106 and the conducting wire 105. If the content of the soft magnetic material in the insulating layer 106 is high, the isolation insulating film 109 is effective for electrically isolating the conducting wires 105.

In FIGS. 1A to 1C, the mechanical strength of the ID chip is enhanced by using a cover material 103. However, the cover material 103 is not necessarily used for the ID chip of the present invention. For example, the mechanical strength of an ID chip may be enhanced by covering the integrated circuit 100 and the antenna 101 with resin or the like. In addition, the mechanical strength of an ID chip may be enhanced by controlling the thickness of the insulating layer 106.

The integrated circuit 100 and the antenna 101 may be formed on the substrate 102 directly if the substrate 102 has a heat resistance property, which can withstand a heat treatment during the process of manufacturing the integrated circuit 100. When using a substrate which is inferior in the heat resistance, like a plastic substrate, as the substrate 102, after forming the integrated circuit over a heat resistant substrate, the integrated circuit 100 and the antenna 101 may be attached to the substrate 102.

The conducting wire 105 used for the antenna 101 can be formed by using a conductive material containing one or more of metals such as Ag, Au, Cu, Pd, Cr, Mo, Ti, Ta, W, Al, Fe, Co, Zn, Sn, and Ni or metal compounds thereof. The conducting wire 105 can be formed by a printing method, a photolithography, a plating method, a vapor deposition, a droplet discharging method or the like. The droplet discharging method is a method for forming a predetermined pattern by discharging droplets containing a predetermined composition from a minute hole, which includes an ink-jet method. The printing method includes a screen-printing method, an offset printing method and the like.

In FIG. 1C, the conducting wire 105 is formed from a single layer conductive film, but may be formed from a plurality of conductive films.

Figure 2A:
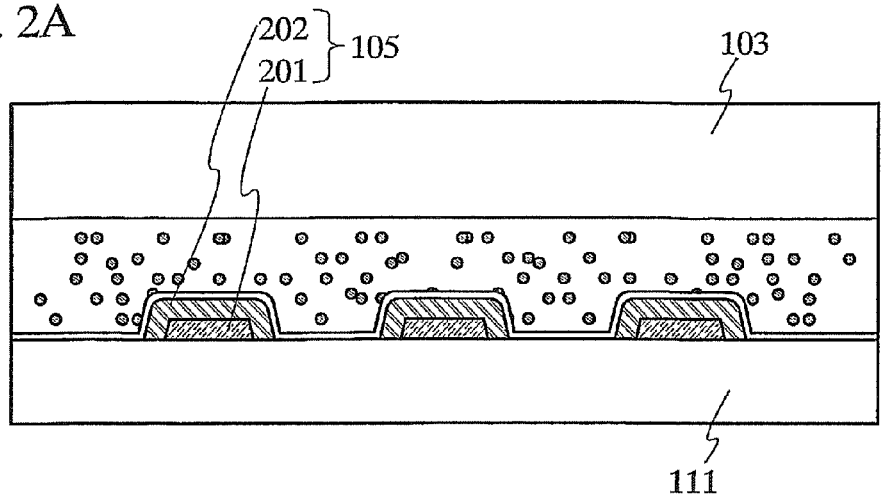
FIGS. 2A to 2C are each a cross-sectional view of an antenna according to one aspect of the present invention.

In FIG. 2A, a first conductor 201 that has been patterned is formed, and a second conductor 202 is formed to cover the first conductor 201 to use the first conductor 201 and the second conductor 202 as conducting wires 105. FIG. 2A shows a cross-section of the conducting wire 105. In FIG. 2A, the first conductor 201 is formed of Ni by a photolithography method, and then, the second conductor 202 is formed of Cu by an electroless plating method to cover the first conductor 201. Note that the first conductor 201 can be formed by a printing method, a vapor deposition method, a droplet discharging method or the like in addition to a photolithography method. The second conductor 202 can be formed by an electroplating method, a droplet discharging method or the like, in addition to an electroless plating method.

Materials for the first conductor 201 and the second conductor 202 are not limited to the structure shown in FIG. 2A. In FIG. 2A, the first conductor 201 is covered with the second conductor 202. However, the second conductor 202 covering the first conductor 201 does not necessarily have a single layer. The second conductor 202 having a plurality of stacked layers may cover the first conductor 201.

Figure 2B:
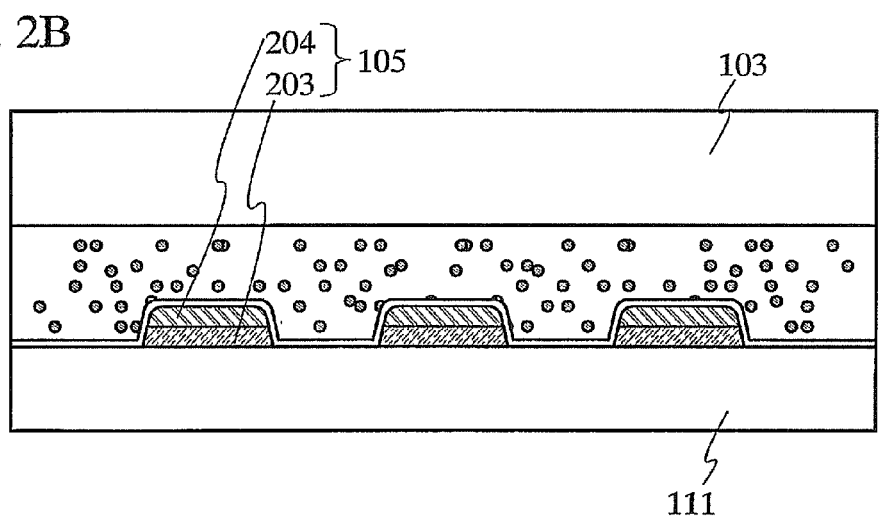

In FIG. 2B, a plurality of conductive films are stacked and patterned by a photolithography method to form the conducting wires 105. FIG. 2B shows a cross-section of the conducting wire 105 in this case. In FIG. 2B, a second conductor 204 made of Al is stacked over a first conductor 203 made of Ti.

Materials for the first conductor 203 and the second conductor 204 are not limited to the structure shown in FIG. 2B. FIG. 2B shows a structure in which the first conductor 203 and the second conductor 204 are stacked. However, three or more layer of conductors may be stacked to form the conducting wire 105.

As shown in FIG. 2B, after plural stacked conductors are formed, the plural stacked conductors may be covered with another conductor to form the conducting wire 105 as shown in FIG. 2A.

Figure 2C:
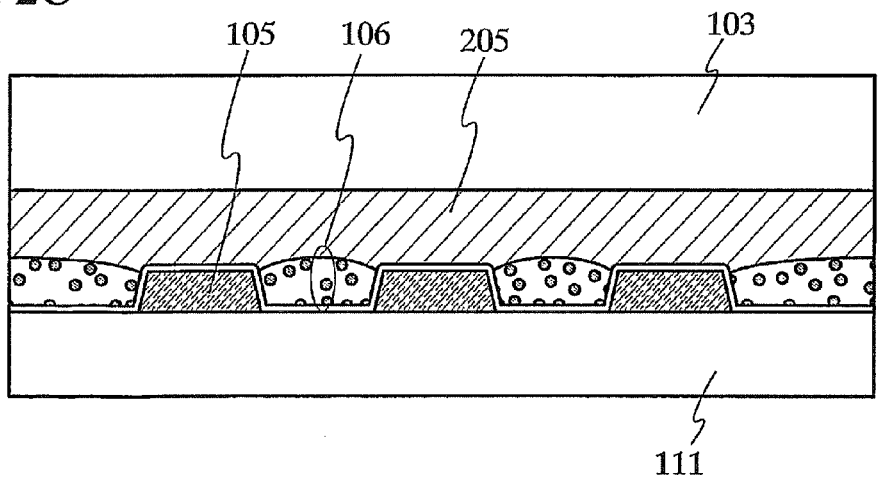

The conducting wire 105 is not necessarily covered with the insulating layer 106. The insulating layer 106 may be formed to at least be in contact with the conducting wire 105. FIG. 2C shows a cross-section of the conducting wire 105 when the insulating layer 106 is formed selectively between the conducting wires 105. The insulating layer 106 can be formed by a droplet discharging method, a printing method or the like. In FIG. 2C, after the conducting wire 105 and the insulating layer 106 are formed, a protective film 205 is preferably formed to cover the conducting wire 105 and the insulating layer 106. The protective film 205 can be formed by using an insulating film made from organic resin or inorganic resin such as siloxane resin.

The isolation insulating film 109 can be formed by a vacuum vapor deposition method, a sputtering method, a CVD method or the like. However, a droplet discharging method, a printing method and the like can be employed to selectively form the isolation insulating film 109.

Figure 3A:
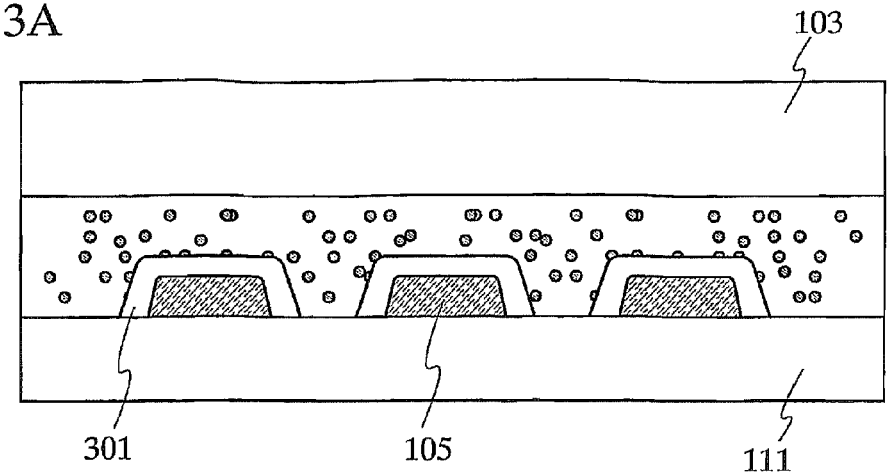
FIGS. 3A to 3C are each a cross-sectional view of an antenna according to one aspect of the present invention.
Figure 3B:
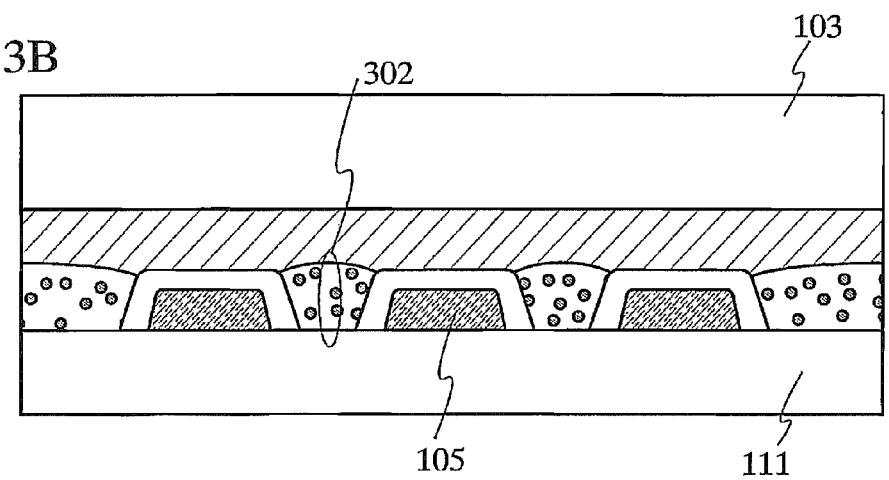

FIG. 3A shows an example in which an isolation insulating film 301 is formed selectively to cover the conducting wire 105 by a droplet discharging method. In FIG. 3A, organic resin or inorganic resin such as siloxane resin can be used for the isolation insulating film 301. Note that an insulating layer 302 may be also formed selectively between the conducting wires 105 in FIG. 3A, as shown in FIG. 3B.

Figure 3C:
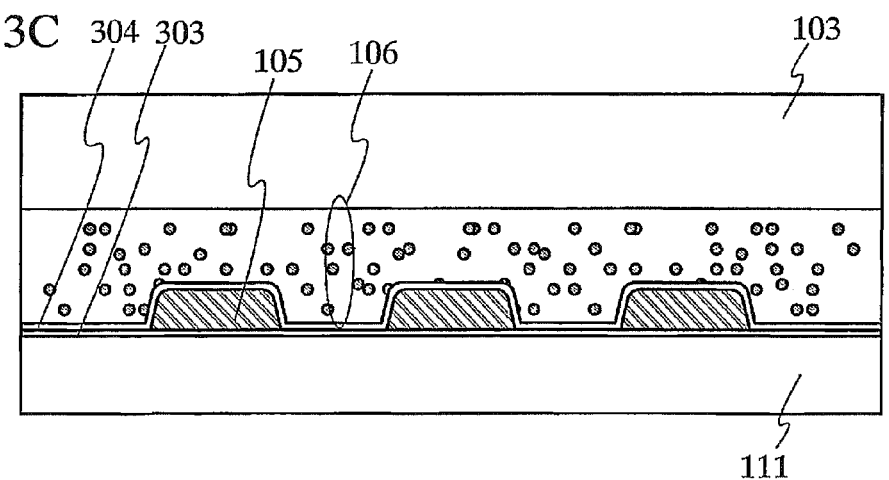

A silicon nitride film, a silicon nitride oxide film or the like having high barrier property may be formed between the conducting wire 105 and the interlayer insulating film 111. FIG. 3C shows a cross-section of the conducting wires 105 when an insulating film 303 such as a silicon nitride film or a silicon nitride oxide film having high barrier property is formed between the conducting wires 105 and the interlayer insulating film 111. The insulating film 303 having high barrier property is formed. Therefore, when a metal such as Cu that adversely affects characteristics of a semiconductor element is used, diffusion of the metal into the semiconductor element can be suppressed by the insulating film.

If a metal that adversely affects characteristics of a semiconductor element is used for fine particles in the insulating layer 106 as well as for the conducting wire 105, diffusion of the metal into the semiconductor element can be suppressed by the insulating film. Specifically, an isolation insulating film 304 to cover the conducting wires 105 and the interlayer insulating film 111 is formed from an insulating film such as a silicon nitride film or a silicon nitride oxide film having high barrier property, thereby suppressing diffusion of the metal used for the fine particles in the insulating layer 106 into the semiconductor element.

A specific manufacturing method of the ID chip of the present invention will described. In this embodiment mode, an insulated and isolated TFT is shown as an example of semiconductor elements. However, the semiconductor element used in an integrated circuit is not limited to this and various circuit elements can be used.

Figure 4A:
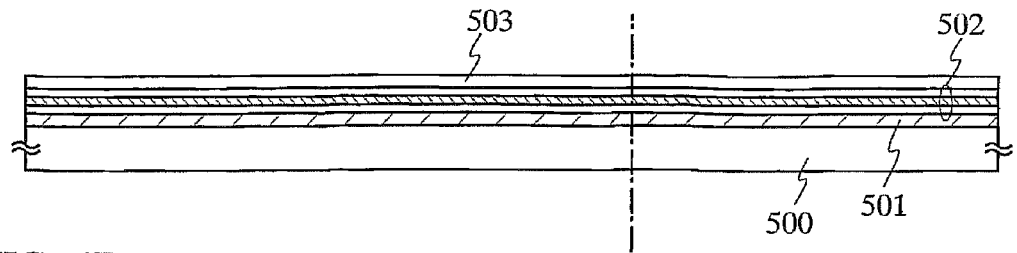
FIGS. 4A to 4E each show a manufacturing method of an ID chip according to one aspect of the present invention.

As shown in FIG. 4A, a separation layer 501 is formed on a substrate (a first substrate) 500 which is heat resistant. For example, glass substrates such as a barium borosilicate glass and an alumino borosilicate glass, a quartz substrate, a ceramic substrate, and the like can be used for the first substrate 500. In addition, a metal substrate including a stainless substrate or a semiconductor substrate may be used. A substrate made from synthetic resin having flexibility such as plastic generally has a tendency in which the allowable temperature limit is lower than the above described substrates, but such a substrate made from synthetic resin can be used as long as it can resist the processing temperature in the manufacturing steps.

An amorphous silicon film, a polycrystalline silicon film, a single crystal silicon film, a micro crystalline silicon film (including a semiamorphous silicon film) and the like which mainly include silicon can be used for the separation layer 501. The separation layer 501 can be formed by a sputtering method, a low pressure CVD method, a plasma CVD method or the like. In this embodiment mode, an amorphous silicon of about 50 nm thick is formed by a low pressure CVD method and is used as the separation layer 501. The separation layer 501 is not limited to silicon and a material that can be removed selectively by etching may be used. The thickness of the separation layer 501 is preferably 10 nm to 100 nm. The thickness of semiamorphous silicon may be 30 nm to 50 nm.

A base film 502 is formed over the separation layer 501. The base film 502 is provided to prevent an alkali metal such as Na or an alkali earth metal contained in the first substrate 500 from diffusing into the semiconductor film and adversely affecting characteristics of the semiconductor element such as a TFT. In addition, the base film 502 also has a function of protecting the semiconductor element in the later step of separating the semiconductor element. The base film 502 may have a single layer or a plurality of laminated insulating films. Thus, the base film 502 is formed by using an insulating film such as silicon oxide, silicon nitride or silicon nitride oxide that can prevent an alkali metal or an alkali earth metal from diffusing into the semiconductor film.

In this embodiment mode, a SiON film of 100 nm thick, a SiNO film of 50 nm thick, and a SiON film of 100 nm are sequentially formed to form the base film 502, and the material, thickness, number of laminations of each film are not limited thereto. For example, instead of the SiON film in the lower layer, siloxane resin of 0.5 μm to 3 μm in film thickness may be formed by a spin coating method, a slit coating method, a droplet discharging method, a printing method or the like. Instead of the SiNO film in the middle layer, a silicon nitride film (such as SiNx or $Si_3N_4$) may be formed. Instead of the SiON film in the upper layer, a $SiO_2$ film may be used. In addition, the thickness of each film is preferably 0.05 μm to 3 μm and can be freely selected from the range of 0.05 μm to 3 μm.

Alternatively, a SiON film or a $SiO_2$ film, a siloxane resin film and a $SiO_2$ film are sequentially formed as the base film 502.

The silicon oxide film can be formed by a thermal CVD method, a plasma CVD method, an atmospheric pressure CVD method, a bias ECRCVD method or the like using a mixture gas of $SiH_4/O_2$, TEOS (tetraethoxysilane)/$O_2$ or the like. In addition, the silicon nitride film can typically be formed by a plasma CVD method using a mixture gas of $SiH_4/NH_3$. In addition, the silicon oxynitride film (SiOxNy: x>y) and the silicon nitride oxide film (SiNxOy: x>y) can typically be formed by a plasma CVD method using a mixture gas of $SiH_4/N_2O$.

A semiconductor film 503 is formed over the base film 502. Preferably, the semiconductor film 503 is formed without being exposed to the air after forming the base film 502. The thickness of the semiconductor film 503 is set to be 20 to 200 nm (desirably, 40 to 170 nm, more preferably, 50 to 150 nm). The semiconductor film 503 may be an amorphous semiconductor, a semiamorphous semiconductor or a polycrystalline semiconductor. Silicon germanium as well as silicon can also be used as the semiconductor film. When using silicon germanium, the concentration of germanium is preferably set to be about 0.01 to 4.5 atomic %.

The semiconductor film 503 may be crystallized by a known method. A laser crystallization method using laser light and a crystallization method using a catalytic element are given as the known crystallization methods. Alternatively a method that combines the crystallization method using a catalytic element and the laser crystallization method can be used. When an excellent heat resistant substrate like quartz is used as the first substrate 500, any of a thermal crystallization method using an electrically-heated furnace, a lamp annealing crystallization method using infrared light, and the crystallization method using a catalytic element may be combined with high temperature annealing of about 950° C. as a crystallization method.

In the case of the laser crystallization, for example, the semiconductor film 503 is subjected to thermal annealing at 500° C. for one hour to enhance a resistance property with respect to a laser beam prior to performing laser crystallization. A continuous wave solid-state laser is used and a laser beam with second to fourth harmonics of the fundamental wave is irradiated to obtain a crystal with a large grain size. Typically, for instance, the second harmonic (532 nm) or the third harmonic (355 nm) of Nd:$YVO_4$ laser (fundamental wave with 1064 nm) is preferably used. Concretely, a laser beam emitted from the continuous wave $YVO_4$ laser is converted into a harmonic by a nonlinear optical element to obtain a laser beam with 10 W output. The laser beam is preferably formed to have a rectangular shape or an elliptical shape on a surface of the semiconductor film 503 to be irradiated with the laser beam. In this case, the power density of about 0.01 to 100 $MW/cm^2$ (preferably, 0.1 to 10 $MW/cm^2$) is required. The scanning rate is approximately set to be about 10 to 2,000 cm/sec to irradiate the semiconductor film.

While the oscillation frequency of a pulsed laser beam is set to be 10 MHz or more, laser crystallization may be carried out using a much higher frequency band than a frequency band of several tens Hz to several hundreds Hz, which is generally used. The period from irradiating a pulsed laser beam onto the semiconductor film to curing the semiconductor film completely is considered to be several tens nsec to several hundreds nsec. By utilizing the above-mentioned frequency band, the next pulsed laser beam can be irradiated to the semiconductor film until the semiconductor film is melted due to irradiation of a laser beam and then solidified. Therefore, a solid-liquid interface can be moved continuously in the semiconductor film, so that the semiconductor film having crystal grains, which are continuously grown in the scanning direction, is formed. Specifically, an aggregate of the crystal grains each of which has a width of 10 to 30 μm in a scanning direction and a width of 1 to 5 μm in a direction perpendicular to the scanning direction can be obtained. The semiconductor film in which almost no crystal grain boundaries are formed in the channel direction of a TFT can be formed by forming the single crystal grains growing in the scanning direction.

As for the laser crystallization, laser light of the fundamental wave of a continuous wave laser and laser light of the harmonic of a continuous wave laser may be irradiated in parallel. Alternatively, laser light of the fundamental wave of a continuous wave laser and laser light of the harmonic of a pulsed laser may be irradiated in parallel.

A laser beam may be irradiated under an inert gas atmosphere such as rare gas and nitrogen. Thus, unevenness in the semiconductor surface due to the laser irradiation can be prevented and fluctuation of a threshold value due to the fluctuation of interface state density can be suppressed.

By the above described laser irradiation, the semiconductor film 503 with improved crystallinity is formed. Note that a polycrystalline semiconductor may in advance be formed by a sputtering method, a plasma CVD method, a thermal CVD method or the like.

The semiconductor film 503 is crystallized in this embodiment mode, but an amorphous silicon film or a microcrystalline semiconductor film may be used in the next process without performing the crystallization. A TFT using an amorphous semiconductor or a microcrystalline semiconductor needs fewer manufacturing steps than a TFT using a polycrystalline semiconductor, and thus, has advantageous effects of reducing costs and enhancing yield.

The amorphous semiconductor can be obtained by performing glow discharge decomposition of silicide gas. Typically, $SiH_4$ and $Si_2H_6$ are cited as examples for the silicide gas. These silicide gases may be diluted with hydrogen or hydrogen and helium.

A semiamorphous semiconductor has an intermediate structure between an amorphous structure and a crystalline structure (including a single crystalline structure, and a polycrystalline structure), and a third state that is stable with respect to free energy. Such a semiamorphous semiconductor has a crystal structure that includes a short range order and lattice distortion. Crystal grains of 0.5 nm to 20 nm in size can be contained and dispersed in a non-single crystal semiconductor. As for the semiamorphous semiconductor, the Raman spectrum shifts to the lower side of a wave number of 520 $cm^{-1}$, and a diffraction peak of (111) and (220) derived from a silicon crystal lattice is observed in x-ray diffraction. Further, the semiamorphous semiconductor contains hydrogen or halogen of 1 atomic % or more for terminating a dangling bond. Herein, the semiamorphous semiconductor is referred to as a SAS for convenience. When a rare gas element such as helium, argon, krypton, or neon is mixed into a SAS (semiamorphous semiconductor), the lattice distortion is further increased and the stability is thus enhanced, thereby obtaining an excellent semiamorphous semiconductor (SAS).

The SAS is formed by glow discharge decomposition of silicide gas. $SiH_4$ is a representative silicide gas. In addition to $SiH_4$, $Si_2H_6$, $SiH_2Cl_2$, $SiHCl_3$, $SiCl_4$, $SiF_4$ and the like can be used as the silicide gas. The silicide gas may also be diluted with hydrogen, or a mixture of hydrogen and one or more rare gas elements selected from helium, argon, krypton, and neon so that the SAS can be easily formed. The dilution ratio is preferably set to be in the range of 1:2 to 1:1,000. In addition, a carbide gas such as $CH_4$ and $C_2H_6$ or germanium gas such as $GeH_4$ or $GeF_4$, or $F_2$ may be mixed in the silicide gas so that the width of the energy band may be adjusted in the range of 1.5 to 2.4 eV or 0.9 to 1.1 eV.

In the case of using a gas containing a mixture of $SiH_4$ and $H_2$ or a gas containing a mixture of $SiH_4$ and $F_2$, for example, when a TFT is manufactured using the semiamorphous semiconductor, the subthreshold coefficient (S value) of the TFT can be set to be 0.35 V/dec or lower, typically, 0.25 to 0.09V/dec, and the carrier mobility thereof can be set to be 10 $cm^2$/Vsec. For example, when a 19-stage ring oscillator is formed by using the 1 using the above semiamorphous semiconductor, a characteristic of the oscillation frequency of 1 MHz or more, preferably 100 MHz or more at the power supply voltage of 3 to 5 V can be obtained. In addition, the delay time for each stage of an inverter can be 26 ns, preferably 0.26 ns or less at the power supply voltage of 3 to 5 V.

Figure 4B:
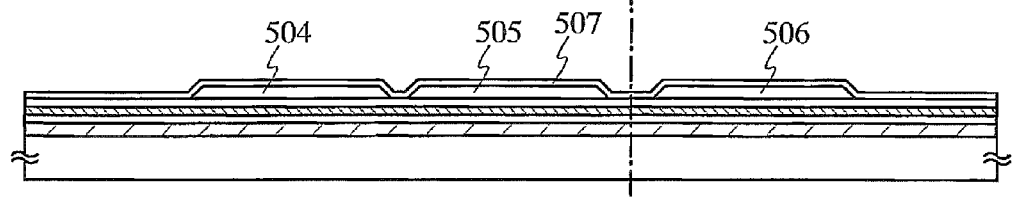
Figure 4C:
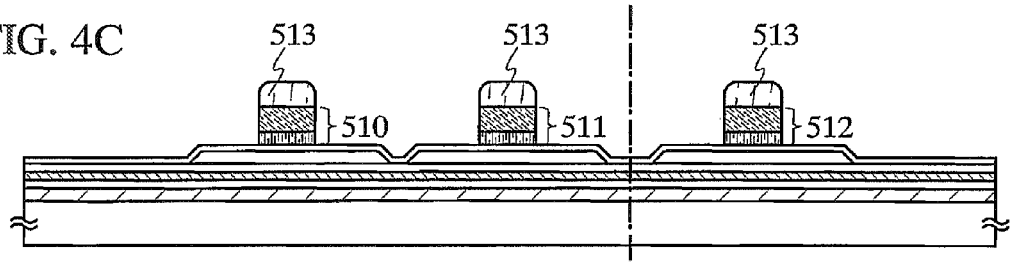

As shown in FIG. 4B, the semiconductor film 503 is patterned to form island-like semiconductor films 504 to 506. A gate insulating film 507 is formed to cover the island-like semiconductor films 504 to 506. A film including silicon nitride, silicon oxide, silicon nitride oxide or silicon oxynitride as a single layer or a lamination layer can be formed as the gate insulating film 507 by a plasma CVD method or a sputtering method. In laminating the films, for example, a three-layer structure of a silicon oxide film, a silicon nitride film and a silicon oxide film over the substrate is preferably employed.

Next, as shown in FIG. 4 C, gate electrodes 510 to 512 are formed. In this embodiment mode, after laminating Si, which is added with an n-type impurity, WN and W by a sputtering method, the gate electrodes 510 to 512 are formed by etching using a resist 513 as a mask. Of course, the material, structure, and manufacturing method of the gate electrodes 510 to 512 are not limited thereto and can be selected appropriately. For example, a lamination structure of NiSi with Si with an n-type impurity added, or a lamination structure of TaN (tantalum nitride) with W (tungsten) may be employed. In addition, the gate electrode may be formed as a single layer of various conductive materials.

A mask of SiOx or the like may be used instead of a resist mask. In this case, a step of patterning is added to form a mask of SiOx, SiON or the like (it is called a hard mask) but the thickness of the mask is reduced less in etching than that of a resist mask. Thus, the gate electrodes 510 to 512 having a desired width can be formed. Alternatively, the gate electrodes 510 to 512 may be formed selectively by a droplet discharging method without using the resist 513.

Various materials can be selected as the conductive material according to the function of the conductive film. If the gate electrode and the antenna are formed simultaneously, materials thereof may be selected considering the function.

Using an etching method, a mixture of gases $CF_4$, $Cl_2$ and $O_2$ or a $Cl_2$ gas is used as the etching gas in forming the gate electrodes, but the etching gas is not limited to these.

Figure 4D:
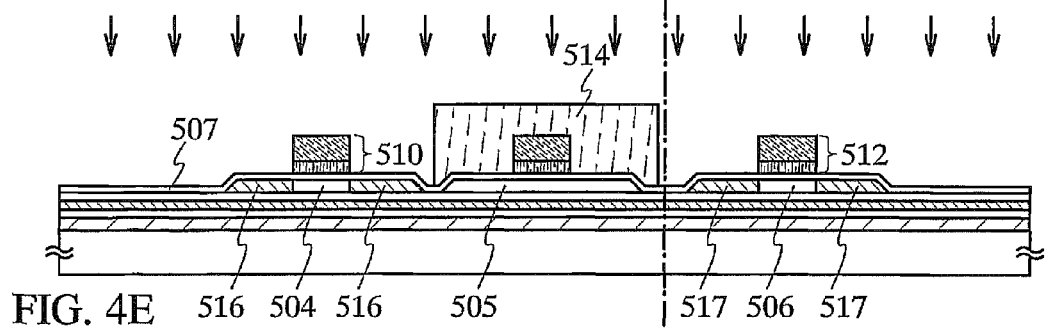

As shown FIG. 4D, the island-like semiconductor film 505 to become a p-channel TFT is covered with a resist 514 and an n-type impurity element (typically, phosphorus (P) or arsenic (As)) is doped into the island-like semiconductor films 504 and 506 to form a low concentration region using the gate electrodes 510 and 512 as masks (a first doping step). The condition of the first doping step is as follows: the dose amount of $1 \times 10^{13}$ to $6 \times 10^{13}/cm^2$, and the accelerating voltage of 50 to 70 keV. However, the condition is not limited thereto. Pairs of low concentration impurity regions 516 and 517 are formed in the island-like semiconductor films 504 and 506 by doping through the gate insulating film 507 by this first doping step. Note that the first doping step may be conducted without covering the island-like semiconductor 505 to become a p-channel TFT with resist.

Figure 4E:
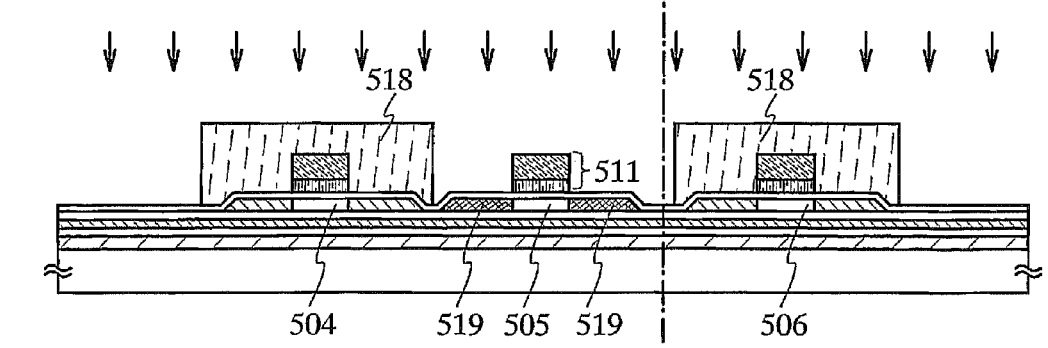

Next, as shown in FIG. 4E, after the resist 514 is removed by asking or the like, a new resist 518 is formed to cover the island-like semiconductor films 504 and 506 to become n-channels TFT. An impurity element (typically, boron (B)) imparting a p-type conductivity is doped into the island-like semiconductor film 505 to form a high concentration region using the gate electrode 511 as a mask (second doping step). The condition of the second doping step is as follows: the dose amount of $1\times10^{16}$ to $3\times10^{16}/cm^2$, and the accelerating voltage of 20 to 40 keV. A pair of p-type high concentration impurity regions 519 is formed in the island-like semiconductor film 505 by doping through the gate insulating film 507 by performing the second doping step.

Figure 5A:
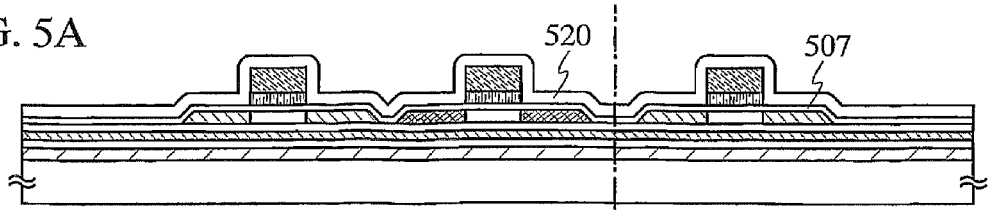
FIGS. 5A to 5E each show a manufacturing method of an ID chip according to one aspect of the present invention.
Figure 5B:
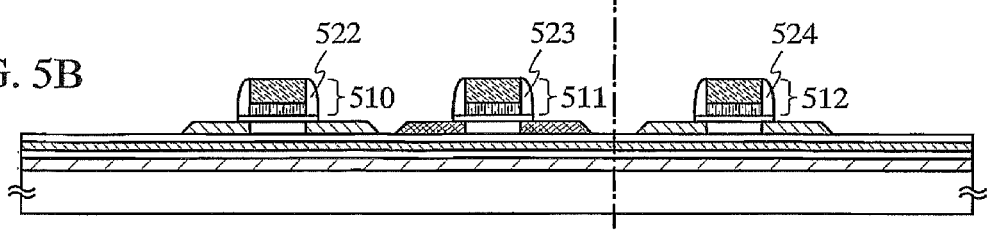

Next, as shown in FIG. 5A, after the resist 518 is removed by asking or the like, an insulating film 520 is formed to cover the gate insulating film 507 and the gate electrodes 510 to 512. In this embodiment mode, an $SiO_2$ film of 100 nm thick is formed by a plasma CVD method. After that, the insulating film 520 and the gate insulating film 507 are etched partially by an etchback method. As shown in FIG. 5B, sidewalls 522 to 524 are formed in a self-alignment manner to be in contact with the sidewalls of the gate electrodes 510 to 512. A mixture gas of $CHF_3$ and He is employed as the etching gas. Note that the step of forming the sidewalls is not limited thereto.

When forming the insulating film 520, an insulating film is also formed over the backside of the first substrate 500. In this case, the insulating film formed over the rear surface of the first substrate 500 may be selectively etched and removed by using resist. In this case, the insulating film formed on the rear surface may be etched and removed together with the insulating film 520 and the gate insulating film 507 in the process of forming the sidewalls 522 to 524 by the etchback method.

Figure 5C:
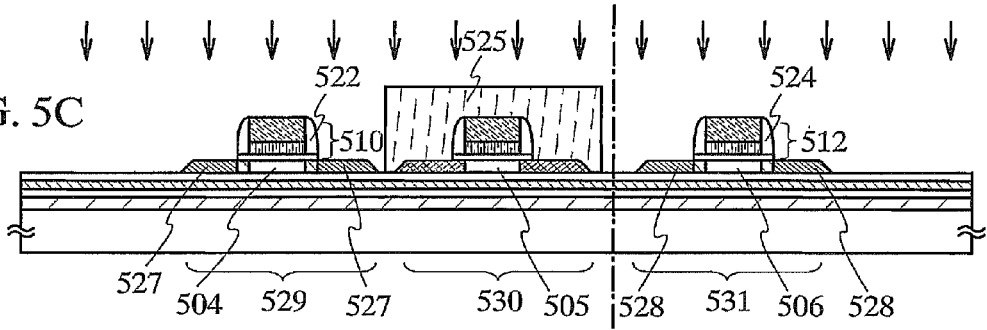

As shown in FIG. 5C, a new resist 525 is formed to cover the island-like semiconductor 505 to become a p-channel TFT, an n-type impurity element (typically, P or As) is doped to form a high concentration region using the gate electrodes 510 and 512 and the sidewalls 522 and 524 as masks (the third doping step). The condition of the third doping step is as follows: the dose amount of $1\times10^{13}$ to $5\times10^{15}/cm^2$, and the accelerating voltage of 60 to 100 keV. Pairs of n-type high concentration impurity regions 527 and 528 are formed in the island-like semiconductor films 504 and 506 by performing the third doping step.

When n-type impurities are doped so as to form a high concentration region, the sidewalls 522 and 524 function as masks to form a low concentration impurity region or an off-set region in which doping is not done in a lower part of the sidewalls 522 and 524. Therefore, the size of the sidewalls 522 and 524 may be adjusted by appropriately changing the conditions of an etchback method in forming the sidewalls 522 and 524 or the thickness of the insulating film 520, so as to control the width of the low concentration impurity region or the off-set region.

After the resist 525 is removed by ashing or the like, thermal activation may be performed to the impurity region. For example, a SiON film of 50 nm is formed and then may be exposed to a heat treatment in a nitrogen atmosphere at 550° C. for four hours.

An SiNx film containing hydrogen may be formed to be 100 nm thick, and then, may be exposed to a heat treatment in a nitrogen atmosphere at 410° C. for one hour to hydrogenate the island-like semiconductor films 504 to 506. Alternatively, a heat treatment may be performed at temperatures from 300° C. to 450° C. for 1 to 12 hours in an atmosphere containing hydrogen to hydrogenate the island-like semiconductor films 504 to 506. As another hydrogenation method, plasma hydrogenation (using hydrogen excited by plasma) may be performed. Through the hydrogenation step, dangling bonds can be terminated by the thermally excited hydrogen. If defects are caused in the semiconductor film by bending a second substrate 548 after attaching the semiconductor elements to the flexible second substrate 548 in the subsequent step, the concentration of hydrogen contained in the semiconductor film is set to be $1\times10^{19}$ to $1\times10^{22}$ atoms/$cm^3$, preferably, $1\times10^{19}$ to $5\times10^{20}$ atoms/$cm^3$ by the hydrogenation, so that the defects can be terminated by the hydrogen contained in the semiconductor film. In addition, halogen may be contained in the semiconductor film to terminate the defects.

Through the above described series of steps, n-channel TFTs 529 and 531, and a p-channel TFT 530 are formed. In the above described manufacturing steps, the conditions of an etchback method or the thickness of the insulating film 520 are changed appropriately and the sizes of the sidewalls are adjusted to form TFTs having a channel length of 0.2 µm to 2 µm. It is noted that, in this embodiment mode, a bottom gate structure (an inverted staggered structure) may be employed although a top gate structure is employed for the TFTs 529 to 531.

Additionally, thereafter, a passivation film to protect the TFT 529 to 531 may be formed. Thus, the passivation film is preferably formed by using silicon nitride, silicon nitride oxide, aluminum nitride, aluminum oxide, silicon oxide or the like which can prevent an alkali metal or an alkali earth metal from entering the TFTs 529 to 531. Specifically, for example, a SiON film of about 600 nm thick can be used for the passivation film. In this case, the hydrogen treatment process may be conducted after forming the SiON film. Like this, a three-layer structure of insulating films, in which SiON, SiNx, and SiON are stacked, is formed over the TFT 529 to 531, but the structure or materials thereof are not limited thereto. By the above described structure, the TFT 529 to 531 are covered with the base film 502 and the passivation film, thereby further preventing an alkali metal such as Na or an alkali earth metal from diffusing into the semiconductor film used in a semiconductor element and from adversely affecting characteristics of the semiconductor element.

Figure 5D:
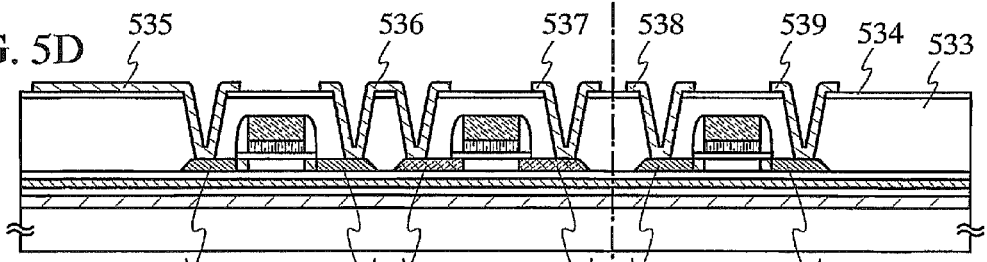

Next, a first interlayer insulating film 533 is formed to cover the TFTs 529 to 531 as shown in FIG. 5D. Organic resin having heat-resistance such as polyimide, acryl or polyimide can be used for the first interlayer insulating film 533. Besides the organic resin, a low dielectric constant material (low-k material) or a resin containing Si—O—Si bond (hereinafter, referred to as a siloxane resin) or the like can be used. Siloxane has a skeleton structure with a bond of silicon (Si) and oxygen (O). As a substituent thereof, an organic group including at least hydrogen (such as alkyl group or aromatic hydrocarbon) is used. Further, a fluoro group may be used for the substituent. Also, an organic group including at least hydrogen and a fluoro group may be used for the substituent. In forming the first interlayer insulating film 533, a spin-coating method, a dipping method, a spray coating method, a droplet discharging method (an ink-jet method, a screen-printing method, an off-set printing method and the like) a doctor knife, a roll coater, a curtain coater, a knife coater, and the like can be employed depending on the material of the interlayer insulating film. Further, an inorganic material may be used. At this time, a silicon oxide film, a silicon nitride film, a silicon oxynitride film, a PSG (phosphorus silicate glass) film, a PBSG (phosphorus boron silicate glass) film, a BPSG (borophosphosilicate glass) film, an alumina film and the like can be used. Note that these insulating films may be laminated to form the first interlayer insulating film 533.

Further, in this embodiment mode, a second interlayer insulating film 534 may be formed over the first interlayer insulating film 533. As for the second interlayer insulating film 534, a film containing carbon such as DLC (Diamond Like Carbon) or carbon nitride (CN), a silicon oxide film, a silicon nitride film, a silicon nitride oxide film, or the like can be employed. As for the forming method, plasma CVD, atmospheric pressure plasma, or the like can be employed. Alternatively, a photosensitive or nonphotosensitive organic material such as polyimide, acrylic, polyamide, resist, and benzocyclobutene, or a siloxane resin may be employed.

Note that a filler may be mixed into at least one of the first interlayer insulating film 533 and the second interlayer insulating film 534 in order to prevent film detachment or a crack of these films due to stress generated by a difference of a thermal expansion coefficient between the first interlayer insulating film 533 or the second interlayer insulating film 534 and a conductive material or the like of a wiring formed at a subsequent step.

As shown in FIG. 5D, contact holes are formed in the first interlayer insulating film 533 and the second interlayer insulating film 534. Wirings 535 to 539 connecting to the TFTs 529 to 531 are formed. As for an etching gas for forming the contact hole, a mixed gas of $CHF_3$ and He is employed, but the present invention is not limited to this. In this embodiment mode, the wirings 535 to 539 are formed of Al. Here, the wirings 535 to 539 may be formed to have a five-layer structure in which Ti, TiN, Al—Si, Ti and TiN are formed sequentially by sputtering.

By mixing Si into the Al layer, the generation of hillocks can be prevented during resist baking when the wiring is patterned. Instead of the Si, Cu of about 0.5% may be mixed. In addition, by sandwiching the Al—Si layer with Ti or TiN, hillock resistance can be further improved. At the patterning, the above-described hard mask of SiON or the like is preferably employed. Note that the material and the forming method of these wirings are not limited to these, and the aforementioned material for forming the gate electrode may be employed.

The wirings 535 and 536 are connected to the high concentration impurity region 527 of the n-channel TFT 529; the wirings 536 and 537 to the high concentration impurity region 519 of the p-channel TFT 530; and the wirings 538 and 539 to the high concentration impurity region 528 of the n-channel TFT 531; respectively.

Figure 5E:
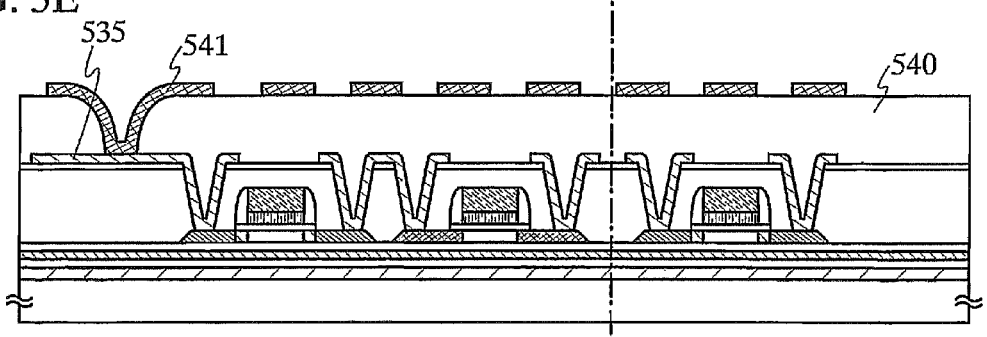

Next, a third interlayer insulating film 540 is formed over the second interlayer insulating film 534 to cover the wirings 535 to 539 as shown in FIG. 5E. The third interlayer insulating film 540 has an opening portion in which a part of the wiring 535 is exposed. In addition, the third interlayer insulating film 540 can be formed by using an organic resin film, an inorganic insulating film or an insulating film including siloxane. Examples of the organic resin film include acryl, polyimide, polyamide, and the like. Examples of the inorganic insulating film include silicon oxide, silicon nitride oxide and the like. At the time, a mask can be formed by a droplet discharging method or a printing method. Alternatively, the third interlayer insulating film 540 itself can be formed by a droplet discharging method or a printing method.

The antenna 541 is formed on the third interlayer insulating film 540. The antenna 541 can be formed of a conductive material containing one or more of metals such as Ag, Au, Cu, Pd, Cr, Mo, Ti, Ta, W, Al, Fe, Co, Zn, Sn and Ni or metal compounds thereof. The antenna 541 is connected to the wiring 535. Although the antenna 541 is directly connected to the wiring 535 in FIG. 5E, the ID chip of the present invention is not limited to this structure. For example, the antenna 541 and the wiring 535 may be electrically connected to each other by using a wiring that is separately formed.

The antenna 541 can be formed by a printing method, a photolithography, a plating method, a vapor deposition method, a droplet discharging method or the like. Although the antenna 541 is formed by using a single-layer conductive film in the embodiment mode, it may be formed by laminating plural conductive films.

By using a printing method or a droplet discharging method, the antenna 541 can be formed without using a mask for light-exposure. Differing from the photolithography in which loss of materials is caused by etching, the droplet discharging method and the printing method can utilize materials efficiently. In addition, the manufacturing cost of ID chips can be reduced since an expensive mask for light-exposure is not required.

When using the droplet discharging method or the various kinds of printing methods, for example, a conductive particle obtained by coating Cu with Ag can also be used. In the case where the antenna 541 is formed by a droplet discharging method, the surface of the third interlayer insulating film 540 is desirably exposed to a treatment for increasing the adhesion of the antenna 541.

In order to increase the adhesion, for example, the following methods can be cited: a metal or a metal compound that can improve the adhesion of a conductive film or an insulating film due to catalytic action is attached to the surface of the third interlayer insulating film 540; an organic insulating film, a metal, and a metal compound each of which is well-adhered to a conductive film or an insulating film to be formed are attached to the surface of the third interlayer insulating film 540; and the surface of the third interlayer insulating film 540 is subjected to plasma processing under atmospheric pressure or reduced pressure to change the properties of the surface thereof. As the metal, which is well-adhered to the conductive film or the insulating film, titanium, titanium oxide, 3d transition elements such as Sc, Ti, V, Cr, Mn, Fe, Co, Ni, Cu, and Zn, and the like can be cited. As the metal compound, oxide, nitride, oxynitride and the like of the above-mentioned metals can be cited. As the organic insulating film, polyimide, siloxane resin and the like are cited, as examples.

When the metal or the metal compound to be attached to the third interlayer insulating film 540 has conductivity, the sheet resistance is controlled so as not to hinder the normal operation of the antenna. Specifically, the average thickness of the metal or the metal compound having conductivity may be controlled to be, for example, 1 to 10 nm. The metal or the metal compound may be partly or entirely oxidized to be insulated. Alternatively, in a region other than a region in which the adhesion is intended to be improved, the attached metal or metal compound may be selectively removed by etching. The metal or the metal compound may be selectively attached to a certain region by the droplet discharging method, the printing method, the sol-gel method, etc. rather than attaching it in advance onto the entire surface of the substrate.

It is not necessary for the metal or the metal compound to have a completely continuous shape like a film on the surface of the third interlayer insulating film 540 and may be dispersed to some extent.

Figure 6A:
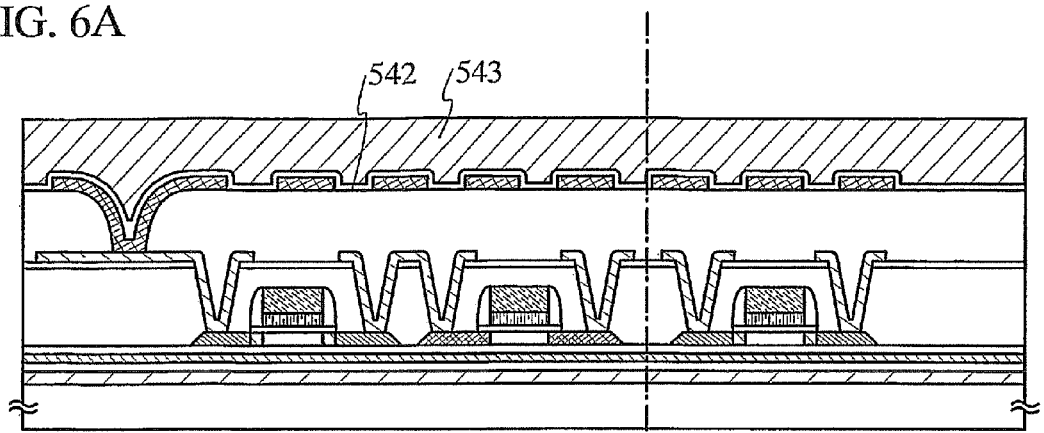
FIGS. 6A to 6C each show a manufacturing method of an ID chip according to one aspect of the present invention.

After forming the antenna 541, an isolation insulating film 542 is formed to cover the antenna 541 as shown in FIG. 6A. For the isolation insulating film 542, organic resin, an inorganic insulating film, siloxane resin can be used. As the inorganic insulating film, for example, a DLC film, a nitride carbon film, a silicon oxide film, a silicon nitride oxide film, a silicon nitride film, an $AlN_X$ film or an $AlN_XO_Y$ film can be used, specifically. In addition, for example, a lamination of a carbon nitride film and a silicon nitride film, a lamination of polystyrene, and the like can be used for the isolation insulating film 542. In this embodiment mode, a silicon nitride film is employed for the isolation insulating film 542.

As shown in FIG. 7C, a protective film 543 is formed to cover the isolation insulating film 542. The protective layer 543 is made from a material that can protect the TFTs 529 to 531 and the wirings 535 to 539 in removing the separation layer 501 by etching in the subsequent step. For example, a water-soluble or alcohol-soluble epoxy resin, acrylate resin or silicon resin is wholly applied to form the protective layer 543.

For forming the protective layer 543 in the embodiment mode, a water-soluble resin (VL-WSHL10 manufactured by Toagosei Co., Ltd.) is applied by spin coating to have a thickness of 30 μm and exposed to light for 2 minutes so as to be cured temporarily. The water-soluble resin is further exposed to UV light from a rear face of the substrate for 2.5 minutes and from a top face thereof for 10 minutes, i.e., for 12.5 minutes in total to be cured completely, thereby obtaining the protective layer 543. When plural kinds of organic resins are laminated, they might be partly dissolved to each other in coating or baking or adhesion thereof might be excessively increased depending on the sorts of solvents contained in the organic resins. Therefore, when the isolation insulating film 542 and the protective layer 543 are both made from organic resins that are soluble in the same solvent, an inorganic insulating film (e.g., an $SiN_X$ film, an $SiN_XO_Y$ film, an $AlN_X$ film or an $AlN_XO_Y$ film) is preferably formed to cover the isolation insulating film 542 such that the protective layer 543 is smoothly removed in the subsequent step.

Figure 6B:
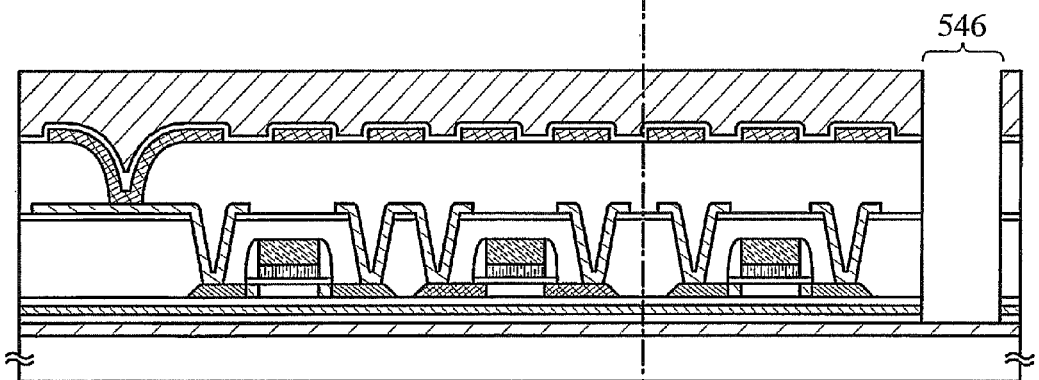

As shown in FIG. 6B, a groove 546 is formed to separate the ID chips from one another. The groove 546 may be deep enough to expose the separation layer 501. The groove 546 can be formed by dicing, scribing, or the like. When the ID chips formed over the first substrate 500 are not necessarily to be separated, the groove 546 may not necessarily be formed.

Figure 6C:
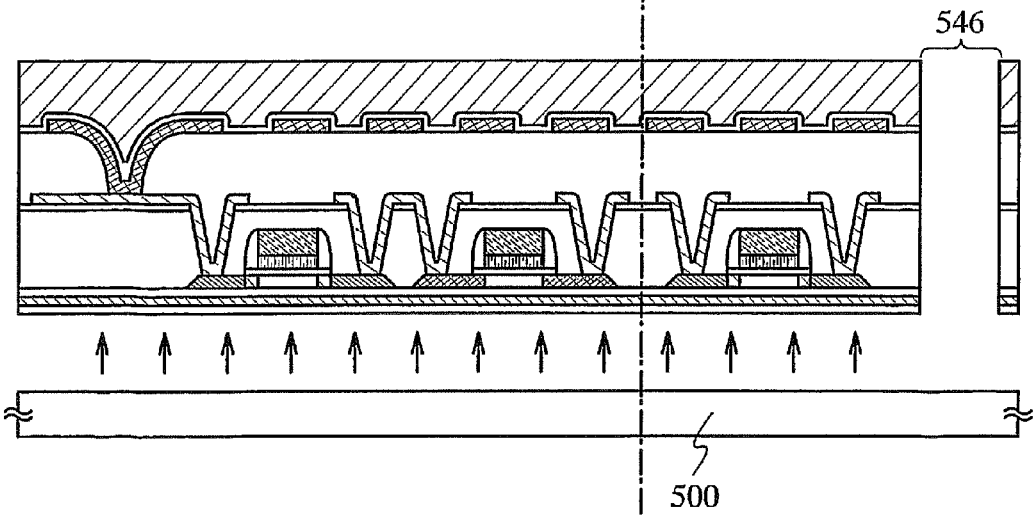

As shown in FIG. 6C, the separation layer 501 is removed by etching. In the embodiment mode, halogen fluoride is used as an etching gas and the gas is introduced through the groove 546. In this embodiment mode, for example, $ClF_3$ (chlorine trifluoride) is employed, and etching is carried out under the conditions as follows: a temperature is set to be 350° C.; a flow rate, 300 sccm; a pressure, $8\times10^2$ Pa (6 Torr); and time, 3 hours. Further, $ClF_3$ gas mixed with nitrogen may be used. By using a halogen fluoride such as $ClF_3$, the separation layer 501 is selectively etched, so that the first substrate 500 can be separated from the TFTs 529 to 531. Note that the halogen fluoride may be in either a gas state or a liquid state.

Figure 7A:
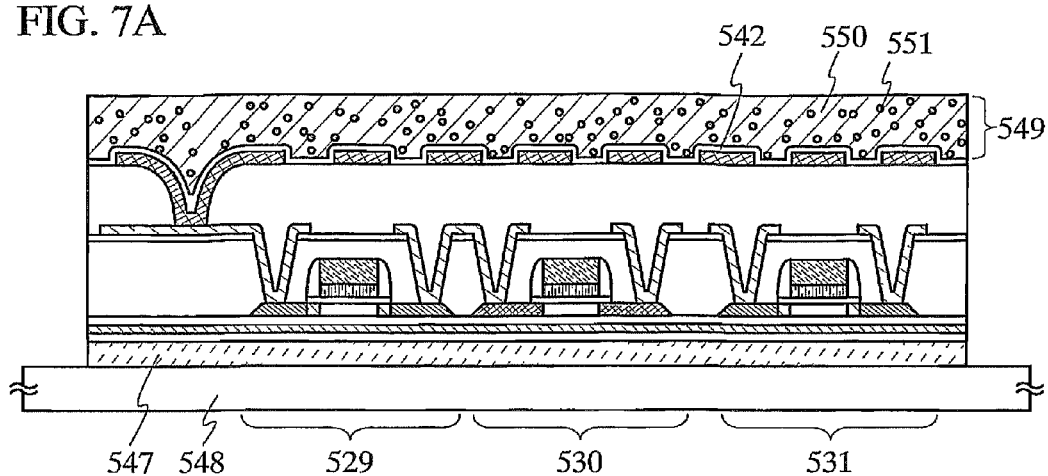
FIGS. 7A and 7B each show a manufacturing method of an ID chip according to one aspect of the present invention.

As shown in FIG. 7A, the separated TFTs 529 to 531 are attached to the second substrate 548 with an adhesive agent 547. A material that can attach the second substrate 548 to the base film 502 is employed for the adhesive agent 547. The following examples of various types of curing adhesive agents including a reactive curing adhesive agent, a thermal curing adhesive agent, a light curing adhesive agent such as an ultraviolet curing adhesive agent, an anaerobic curing adhesive agent and the like can be used as the adhesive agent 547.

As for the second substrate 548, a glass substrate such as barium borosilicate glass or alumino borosilicate glass or a flexible organic material such as paper and plastics can be used. In addition, a flexible inorganic material may be employed as the second substrate 548. As the plastic substrate, ARTON (manufactured by JSR Corporation) made from polynorbornene with a polar radical can be used. Also, the following materials can be cited as the plastic substrate: polyester typified by polyethylene terephthalate (PET), polyether sulfone (PES), polyethylene naphthalate (PEN), polycarbonate (PC), nylon, polyether ether ketone (PEEK), polysulfone (PSF), polyetherimide (PEI), polyarylate (PAR), polybutylene terephthalate (PET), polyimide, acrylonitrile butadiene styrene resin, polyvinyl chloride, polypropylene, polyvinyl acetate, acrylic resin and the like. The second substrate 548 desirably has high thermal conductivity of about 2 to 30 W/mK in order to diffuse the heat generated from the integrated circuit.

As shown in FIG. 7A, an insulating layer 549 is formed to cover the isolation insulating film 542. An insulator 550 in which fine particles 551 made of a soft magnetic material are dispersed is used for the insulating layer 549. As the insulator 550, organic resin such as polyimide, epoxy, acryl, or polyamide can be used. In addition to the organic resin, inorganic resin, e.g. siloxane resin and the like can be employed. As a substituent the siloxane resin, an organic group including at least hydrogen (such as alkyl group or aromatic hydrocarbon) is used. Further, a fluoro group may be used for the substituent. Also, an organic group including at least hydrogen and a fluoro group may be used for the substituent.

As the soft magnetic material used for the fine particles 551, for example, Fe, Co, Ni, or an alloy including some of them, in addition, $3Y_2O_3 \cdot 5Fe_2O_3$ (YIG), $Fe_2O_3$, Fe—Si—Al alloy, Fe—Cr alloy, FeP alloy, or a permalloy in which Ni or Ni—Fe alloy is added with one or some of Mo, Cu, Cr, and Nb can be also used. In addition, a soft ferrite typified by Mn—Zn ferrite can be employed as the soft magnetic material.

It is preferable that concentration and specific surface of the fine particles 551 can be adjusted depending on a soft magnetic material to be used. When the concentration of the soft magnetic material is high, the loss of magnetic flux by eddy current is generated because the resistance of the insulating layer 549 decreases, and thus inductance is hard to be increased. On the contrary, even when the concentration of the soft magnetic material is low, the permeability of the whole insulating layer 549 is too low and thus inductance of the antenna 541 is hard to be increased. It is difficult to uniformly disperse fine particles 551 between conductive wires constituting a part of the antenna 541, since the diameter of the fine particle 551 is too large when specific surface of the fine particles 551 is too small. On the contrary, when specific surface of the fine particles 551 is too large, the fine particles 551 easily aggregate. In this case, it is also difficult to uniformly disperse fine particles 551 between conductive wires. When $Fe_2O_3$ is employed as the soft magnetic material, the insulating layer 549 can be formed so that the specific surface of the fine particles 551 is 50 to 300 $m^2/g$ and the concentration thereof is 40 to 50 mol %.

Then, an adhesive agent 552 is applied over the insulating layer 549 and then the cover material 553 is attached thereto. The cover material 553 can be formed using the same material as the second substrate 548. The thickness of the adhesive agent 552 may be e.g., 10 to 200 μm.

A material that can attach the cover material 553 to the insulating layer 549 is used for the adhesive agent 552. As the adhesive agent 552, for example, various types of curing adhesive agents including a reactive curing adhesive agent, a thermal curing adhesive agent, a light curing adhesive agent such as an ultraviolet curing adhesive agent, an anaerobic curing adhesive agent and the like can be used.

In this embodiment mode, the cover material 553 is attached to the insulating layer 549 by the adhesive agent 552, but the present invention is not limited to this structure. It is possible to attach the insulating layer 549 directly onto the cover material 553 by using resin that serves as the adhesive agent for the insulator 550 included in the insulating layer 549.

Figure 7B:
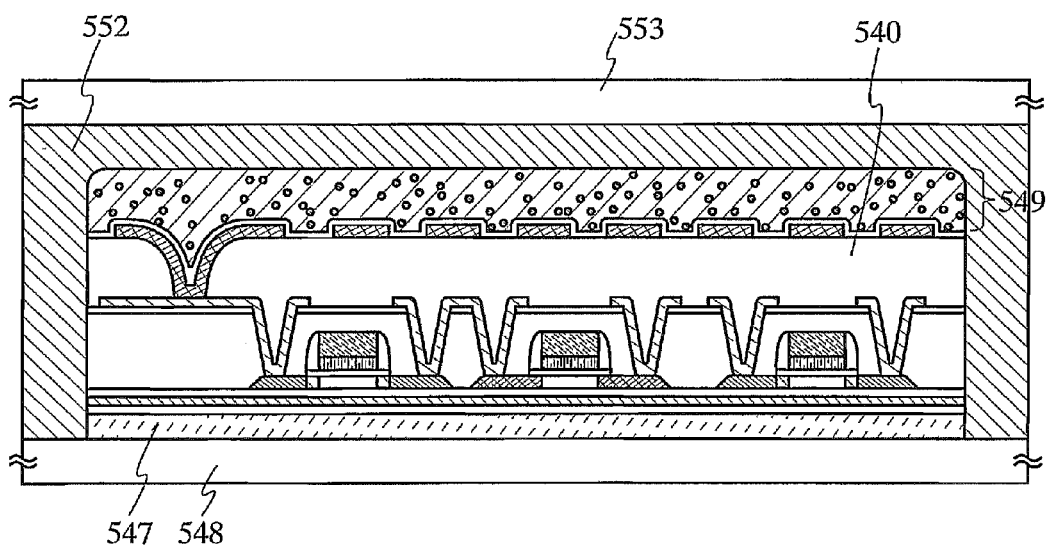

This embodiment mode shows an example using the cover material 553 as shown in FIG. 7B, but the present invention is not limited to this structure. For example, the step shown in FIG. 7A may be the last step for completing an ID chip.

Through the above described steps, an ID chip is completed. By the manufacturing method, an extremely thin integrated circuit that is 0.3 μm to 3 μm typically, 2 μm in total thickness can be formed between the second substrate 548 and the cover material 553. The thickness of the integrated circuit includes various insulating films and interlayer insulating films formed between the adhesive agent 547 and the adhesive agent 552 in addition to the thickness of the semiconductor element itself, but does not include an antenna. The area of the integrated circuit included in an ID chip can be 5 mm×5 mm (25 mm square) or less, preferably, about 0.3 mm×0.3 mm (0.09 mm square) to 4 mm×4 mm (16 mm square).

The mechanical strength of an ID chip can be enhanced by locating the integrated circuit in a position closer to the center between the second substrate 548 and the cover material 553. Specifically, when the distance between the second substrate 548 and the cover material 553 is d, it is preferable to control the thickness of the adhesive agents 547 and 552 so that the distance x between the center in the thickness direction of the integrated circuit and the second substrate 548 can fulfill formula 1 shown below.

$$\frac{1}{2}d - 30 \ \mu m < x < \frac{1}{2}d + 30 \ \mu m \quad \text{[Formula 1]}$$

Preferably, the thickness of the adhesive agents 547 and 552 are controlled to fulfill formula 2 shown below.

$$\frac{1}{2}d - 10 \ \mu m < x < \frac{1}{2}d + 10 \ \mu m \quad \text{[Formula 2]}$$

Figure 8:
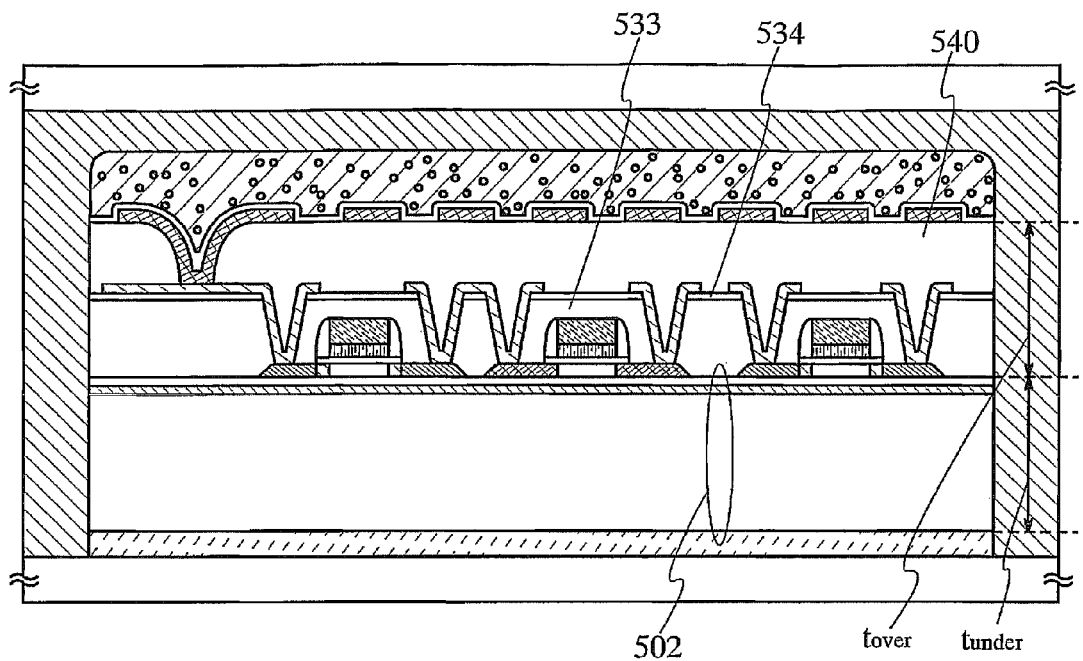
FIG. 8 shows a manufacturing method of an ID chip according to one aspect of the present invention.
Figure 17:
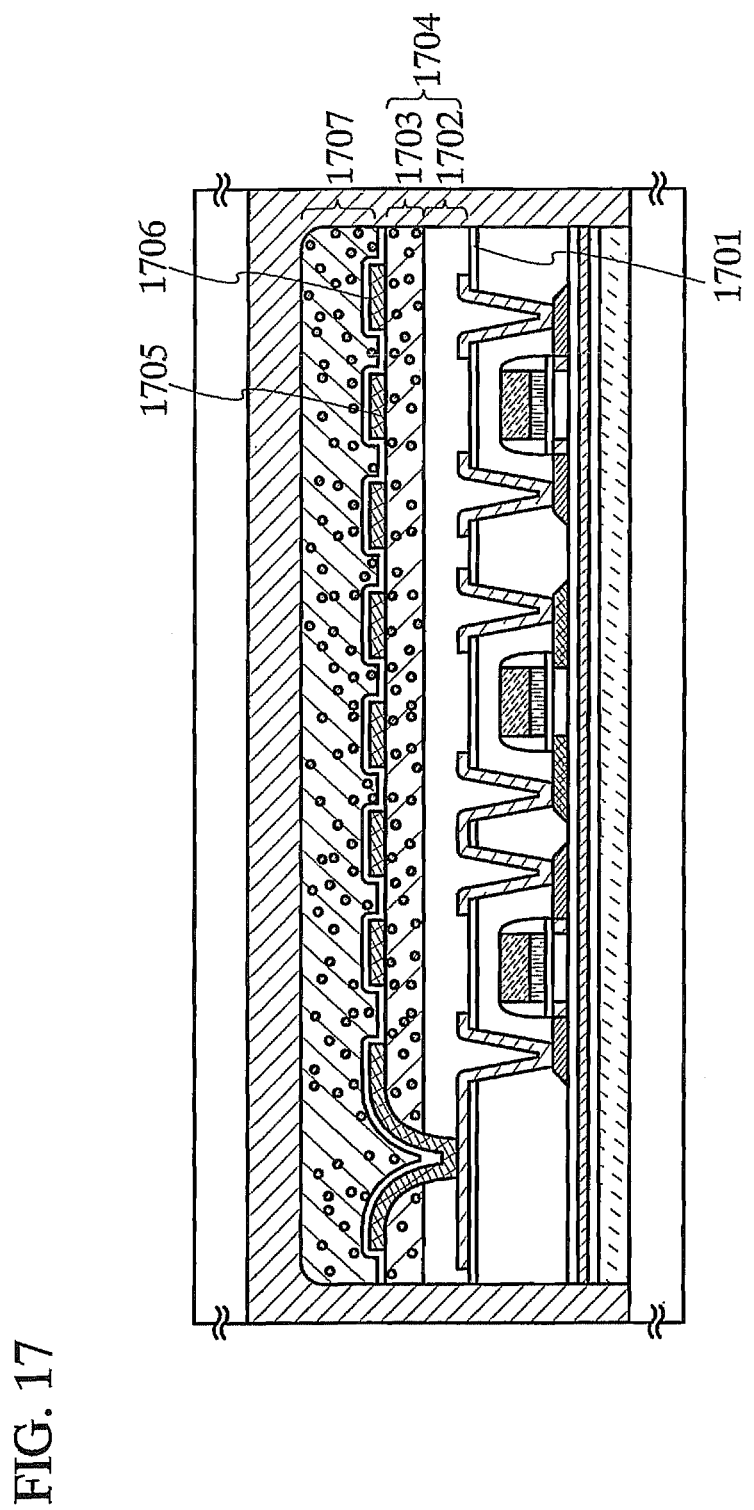
FIG. 17 is a cross-sectional view of an ID chip according to one aspect of the present invention.

As shown in FIG. 8, the thickness of the base film 502, the first interlayer insulating film 533, the second interlayer insulating film 534 or the third interlayer insulating film 540 may be adjusted so that the distance, $t_{under}$ between the island-like semiconductor film of the TFT and the base film of the lower part in the integrated circuit and the distance, $t_{over}$ between the island-like semiconductor film and the third interlayer insulating film 540 are equal or almost equal. By locating the island-like semiconductor film in the center of the integrated circuit, the stress applied on the semiconductor layer can be released and generation of cracks can be prevented In this embodiment mode, only the insulating layer is formed to cover the antenna, but the present invention is not limited to this structure. An insulating layer in which a soft magnetic material is dispersed may be formed between the antenna and the second substrate. FIG. 17 shows a cross-section of an ID chip where a third interlayer insulating film 1704 is formed over a second interlayer insulating film 1701, and the third interlayer insulating film 1704 has two insulating films 1702 and 1703 that are stacked sequentially. An antenna 1705 is formed on the third interlayer insulating film 1704. The insulating film 1703 is closer to the antenna 1705 than the insulating film 1702. In the insulating film 1703, fine particles made of a soft magnetic material are dispersed. Therefore, the insulating film 1703 is equivalent to an insulating layer of the present invention in FIG. 17. In the ID chip shown in FIG. 17, the antenna 1705 is covered with the isolation insulating film 1706, and an insulating layer 1707 in which fine particles made of a soft magnetic material are dispersed is formed to cover the antenna 1705 and the isolation insulating film 1706.

The isolation insulating film 1706 is not necessarily formed. The insulating layer 1707 may be formed only between the conducting wires constituting a part of the antenna 1705. An isolation insulating film may be formed also between the insulating film 1703 and the antenna 1705.

As shown in FIG. 17, the gain of the antenna can be increased by forming the insulating film 1703 serving as the insulating layer.

The method for separating the integrated circuit from the substrate by providing the separation layer between the first substrate 500 that is high heat resistant and the integrated circuit and removing the separation layer by etching is shown in the embodiment mode, however, the method for manufacturing an ID chip according to the present invention is not limited thereto. For example, a metal oxide film may be provided between the high heat resistant substrate and the integrated circuit and the metal oxide film may be crystallized to be weakened so that the integrated circuit is separated from the substrate. Alternatively, a separation layer made from an amorphous semiconductor film containing hydrogen may be provided between the high heat resistant substrate and the integrated circuit and the separation layer may be removed by laser irradiation so that the integrated circuit may be separated from the substrate. Alternatively, the high heat resistant substrate over which the integrated circuit is formed may be mechanically eliminated or removed by etching using a solution or a gas so that the integrated circuit may be separated from the substrate.

When organic resin is used as the adhesive agent 544 in contact with the base film 502, to ensure the flexibility of the ID chip, it is possible to prevent an alkaline metal such as Na or an alkaline earth metal from spreading into the semiconductor film from the organic resin by using a silicon nitride film or a silicon nitride oxide film as the base film 502.

When an ID chip is attached to an object having a curved surface, which is created by a bus bar on a conical surface, a cylindrical surface or the like, and the second substrate 548 of the ID chip is also curved, it is preferable that the direction of the bus bar is the same as a movement direction of carriers of the TFTs 529 to 531. According to the structure, adverse affects due to bending of the second substrate 548 to the characteristics of the TFTs 529 to 531 can be prevented. The percentage of area in the integrated circuit occupied by the island-like semiconductor film is set 1 to 30%, thereby suppressing adverse affects to the characteristics of the TFTs 529 to 531 even when the second substrate 548 is bent.

In general, ID chips in many cases use radio waves with a frequency of 13.56 MHz or 2.45 GHz. Therefore, it is extremely important for expanding the versatility of ID chips that an ID chip is formed so that radio waves of these frequencies can be detected.

The ID chip of this embodiment mode has the advantage that radio waves are less shielded therein as compared with in an ID chip formed by using a semiconductor substrate, and thus signal attenuation due to shielded radio waves can be prevented. Therefore, since a semiconductor substrate is not needed, the cost of the ID chip can be drastically reduced. For example, the case of using a silicon substrate with a diameter of 12 inches is compared with the case of using a glass substrate with a size of 730×920 mm$^2$. The silicon substrate has an area of about 73000 mm$^2$ whereas the glass substrate has an area of about 672000 mm$^2$, that is, the glass substrate is about 9.2 times larger than the silicon substrate. On the glass substrate with an area of about 672000 mm$^2$, about 672000 ID chips each having an area of 1 mm square can be formed when margin for cutting the substrate is not taken into account, which is about 9.2 times more than the ID chips formed on the silicon substrate. In the case of using the glass substrate with a size of 730×920 mm$^2$, which requires fewer manufacturing steps, facility investment cost for mass production of ID chips can be reduced by one-third of the case in which the silicon substrate with a diameter of 12 inches is used. Further, according to the present invention, after an integrated circuit is separated from a glass substrate, the glass substrate can be reused. Therefore, in the case of using the glass substrate, the cost can be significantly reduced when compared to the case of using the silicon substrate, even when the cost of compensating for a broken glass substrate or cleaning a surface of the glass substrate is taken into account. Even if a glass substrate is not reused and discarded, a glass substrate with a size of 730×920 mm$^2$ costs about half as much as a silicon substrate with a diameter of 12 inches. As a result, it is apparent that the cost of an ID chip can be reduced drastically.

Thus, an ID chip using a glass substrate with a size of 730×920 mm$^2$ costs about only one-thirtieth as much as an ID chip using a silicon substrate with a diameter of 12 inches. Since the ID chip is expected to be used as a disposable one, the ID chip of the present invention, which can cost much less, is quite effective for such an application.

Figure 9A:
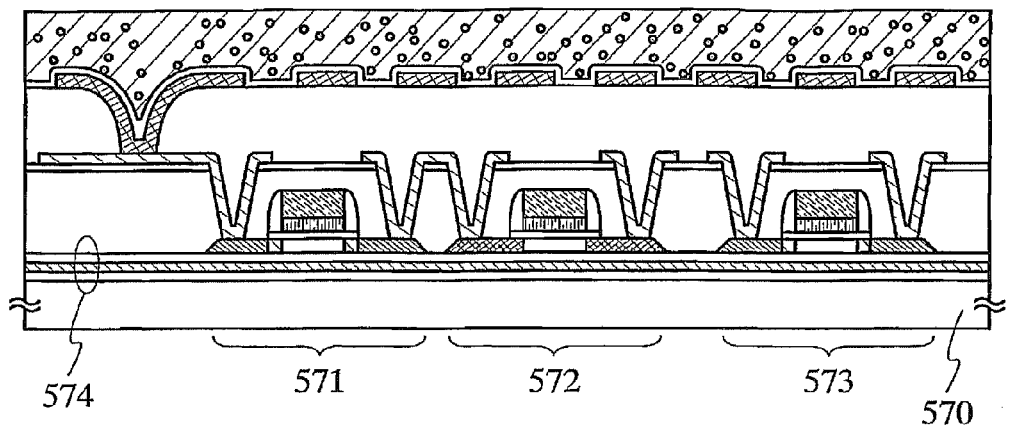
FIGS. 9A and 9B each show a manufacturing method of an ID chip according to one aspect of the present invention.
Figure 9B:
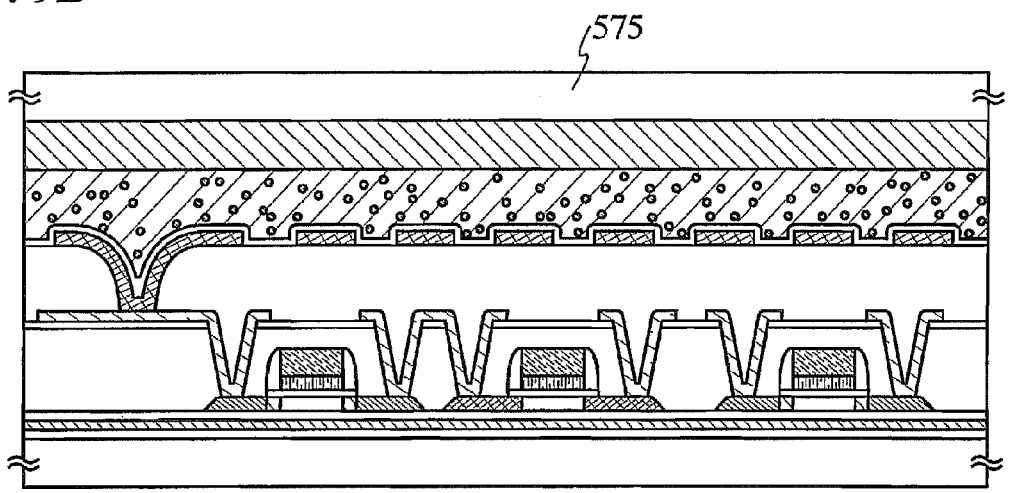

In this embodiment mode, the example in which the integrated circuit is separated and attached to a flexible substrate is shown. However, the present invention is not limited to this structure. For example, an integrated circuit is not necessarily separated if a heat resistant substrate such as a glass substrate, which can resist a heat treatment in the manufacturing steps of the integrated circuit, is used. FIGS. 9A and 9B are each a cross-sectional view showing one mode of an ID chip formed by using a glass substrate.

With respect to the ID chip shown in FIG. 9A, a glass substrate is used as the substrate 570, and TFTs 571 to 573 are formed directly on the substrate 570 without being separated. Specifically, the substrate 570 is formed to be in contact with the base film 574, without an adhesive agent between the TFTs 571 to 573 and the substrate 570. FIG. 9B is a cross-sectional view of the ID chip that is attached with a cover material 575.

Figure 10A:
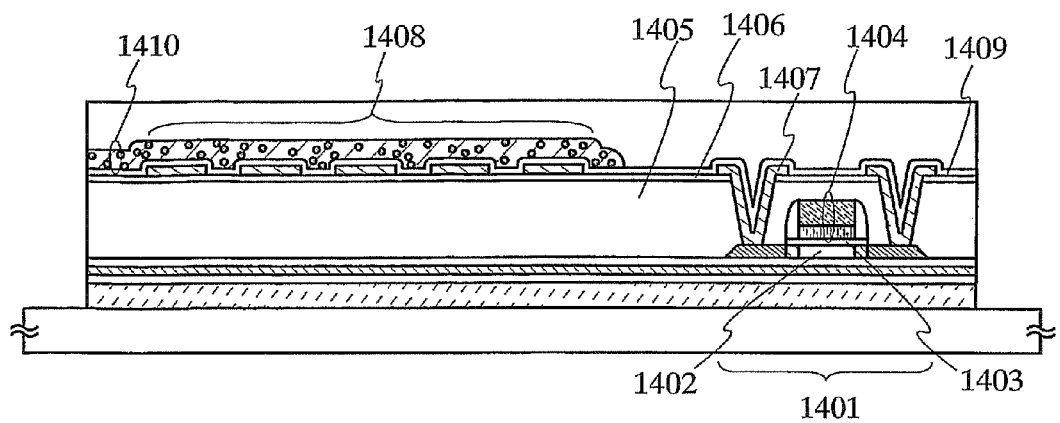
FIGS. 10A and 10B are each a cross-sectional view of an ID chip according to one aspect of the present invention.

A structure of a semiconductor device such as an ID chip in the case of forming a wiring connected to a TFT and an antenna together by patterning a conductive film will be explained with reference to FIG. 10A. FIG. 10A is a cross sectional view of the ID chip according to this embodiment.

In FIG. 10A, a TFT 1401 includes an island-like semiconductor film 1402, a gate insulating film 1403 in contact with the island-like semiconductor film 1402 and a gate electrode 1404 that overlaps the island-like semiconductor film 1402 with the gate insulating film 1403 interposed therebetween. The TFT 1401 is covered with a first interlayer insulating film 1405 and a second interlayer insulating film 1406. In this embodiment, the TFT 1401 is covered with two interlayer insulating films, that is, the first interlayer insulating film 1405 and the second interlayer insulating film 1406. However, this embodiment is not limited to this structure. The TFT 1401 may be covered with a single layer or three or more layers interlayer insulating films.

A wiring 1407 formed on the second interlayer insulating film 1406 is connected to the island-like semiconductor film 1402 through a contact hole formed in the first interlayer insulating film 1405 and the second interlayer insulating film 1406.

An antenna 1408 is formed over the second interlayer insulating film 1406. A conductive film is formed over the interlayer insulating film 1406 and patterned to form the wiring 1407 and the antenna 1408. By forming the antenna 1408 along with the wiring 1407, the number of steps for manufacturing the ID chip can be reduced.

An isolation insulating film 1409 is formed to cover the antenna 1408. Further, an insulating layer 1410 is formed to cover the antenna 1408 and the isolation insulating film 1409. Note that the insulating layer 1410 does not necessarily cover the whole antenna 1408, but it may be formed to be arranged between conducting wires constituting a part of the antenna 1408.

FIG. 10A shows the structure where the isolation insulating layer 1410 is formed selectively in the region where the antenna 1408 is formed, but the present invention is not limited thereto. The isolation insulating layer 1410 may be formed to cover the wiring 1407. Note that the isolation insulating film 1409 preferably covers the wiring 1407 in this case.

Figure 10B:
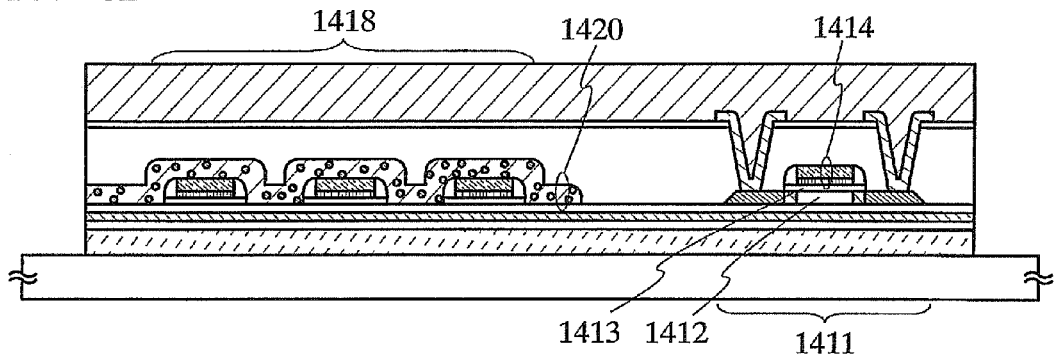

Next, a structure of an ID chip in the case of framing a gate electrode of a TFT and an antenna by patterning a conductive film will be explained with reference to FIG. 10B. FIG. 10B is a cross sectional view of the ID chip according to this embodiment.

In FIG. 10B, the TFT 1411 includes an island-like semiconductor film 1412, a gate insulating film 1413 overlapping the island-like semiconductor film 1412, and a gate electrode 1414 that overlaps the island-like semiconductor film 1412 with the gate insulating film 1413 interposed therebetween. An antenna 1418 is formed over the gate insulating film 1413. A conductive film is formed over the gate insulating film 1413 and patterned to form the gate electrode 1414 and the antenna 1418. By forming the antenna 1418 along with the gate electrode 1414 from the same material, the number of steps for manufacturing the ID chip can be reduced.

An insulating layer 1420 is formed to cover the antenna 1418. Note that the insulating layer 1420 does not necessarily cover the whole antenna 1418, but it may be formed to be arranged between conducting wires constituting a part of the antenna 1418.

FIG. 10B shows the structure where an isolation insulating film is not formed, but the present invention is not limited thereto. The isolation insulating film may be formed between the antenna 1418 and the insulating layer 1420.

In this embodiment mode, the example in which the integrated circuit is separated and attached to a substrate that has been prepared separately is shown. However, the present invention is not limited to this structure. For example, an integrated circuit is not necessarily separated if a heat resistant substrate such as a glass substrate, which can resist a heat treatment in the manufacturing steps of the integrated circuit, is used.

This embodiment can be freely combined with Embodiment Mode.

Embodiment 2

Figure 11:
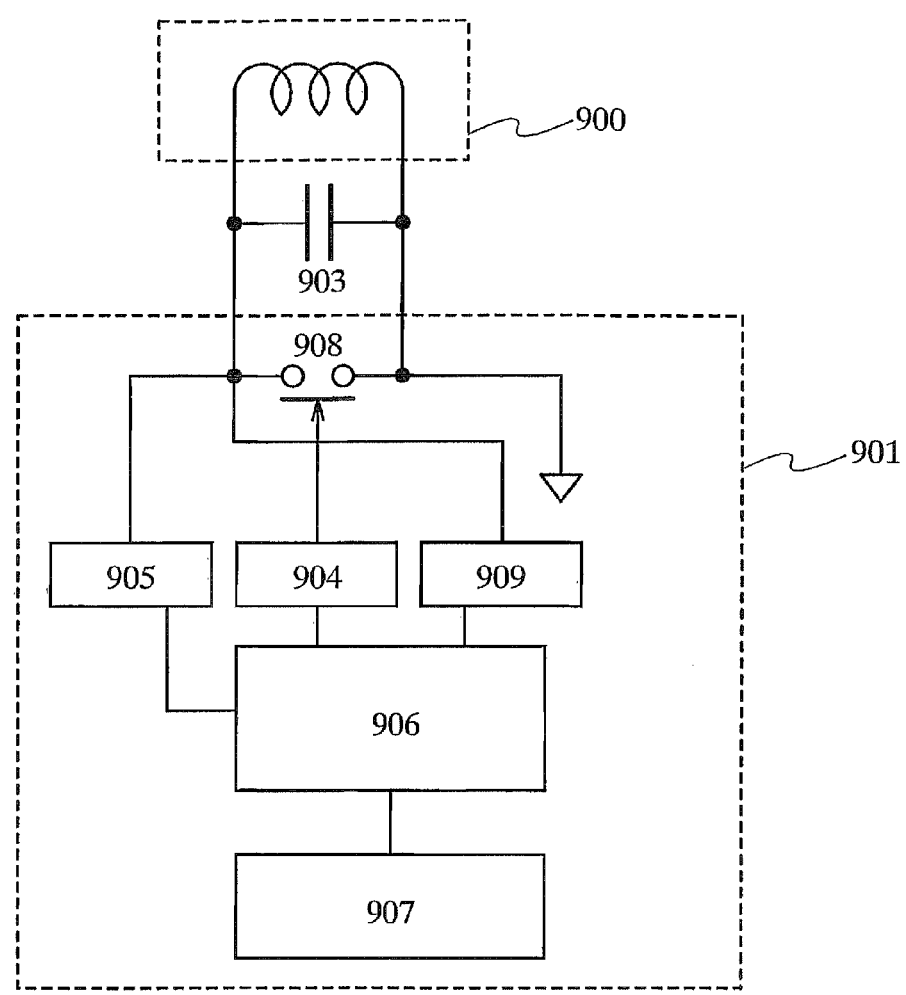
FIG. 11 is a block diagram showing a mode of a functional configuration of an ID chip according to one aspect of the present invention.

Embodiment 2 describes one mode of a functional configuration of a semiconductor device such as an ID chip according to the present invention with reference to FIG. 11.

In FIG. 11, reference numeral 900 denotes an antenna, 901 denotes an integrated circuit, and 903 denotes a capacitor formed between both terminals of the antenna 900. The integrated circuit 901 includes a demodulation circuit 909, a modulation circuit 904, a rectification circuit 905, a microprocessor 906, a memory 907, and a switch 908 for providing load modulation to the antenna 900. In addition, the number of the memory 907 is not limited to one; a plurality of the memories 907 may be provided. As the memory 907, a SRAM, a flash memory, a ROM, a FRAM (registered mark), or the like may be used.

A signal sent from the reader/writer as a radio wave is converted into an alternating electric signal by electromagnetic induction in the antenna 900. The alternating electric signal is demodulated in the demodulation circuit 909 to be sent to the microprocessor 906 at the subsequent stage. Power supply voltage is produced by using an alternating electric signal in the rectification circuit 905 to be supplied to the microprocessor 906 at the subsequent stage. Various kinds of arithmetic processing are carried out according to the inputted signal in the microprocessor 906. The memory 907 stores a program, data or the like used in the microprocessor 906, and can be used as a work place for the arithmetic processing.

Date is sent from the microprocessor 906 to the modulation circuit 904. At this time, the modulation circuit 904 controls the switch 908 to provide load modulation to the antenna 900. The reader/writer can read eventually the data from the microprocessor 906 by receiving the load modulation provided to the antenna 900 as a radio wave.

The ID chip shown in FIG. 11 is illustrative only as one mode of an ID chip according to the present invention. The present invention is not limited thereto. A method for transmitting a signal is not limited to an electromagnetic coupling type as shown in FIG. 11, and an electromagnetic induction type may be used.

This embodiment can be freely combined with at least one of Embodiment Mode and Embodiment 1.

Embodiment 3

Embodiment 3 describes a structure of a TFT used in a semiconductor device such as an ID chip of the present invention.

Figure 12A:
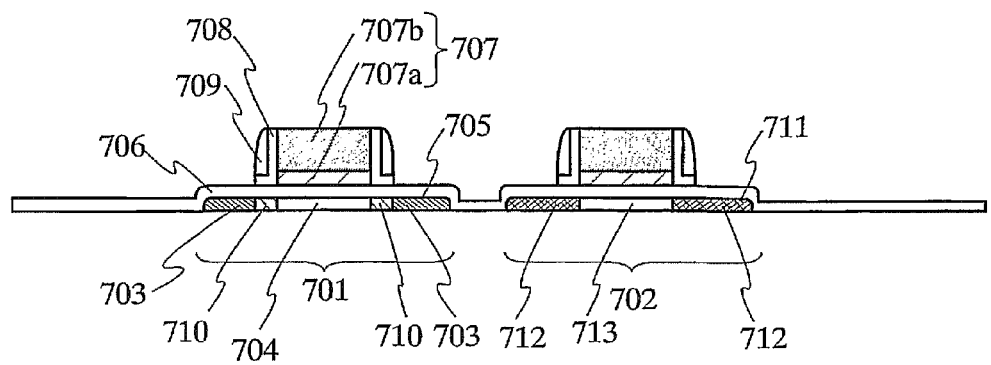
FIGS. 12A to 12C are each a cross-sectional view of a TFT of an ID chip according to one aspect of the present invention.

FIG. 12A shows a cross sectional view of TFT according to the embodiment. Reference numeral 701 represents an n-channel TFT; and 702, a p-channel TFT. The configuration of the n-channel TFT 701 will be explained in detail as an example.

The n-channel TFT 701 includes an island-like semiconductor film 705 to be used as an active layer. The island-like semiconductor film 705 includes two impurity regions 703 to be used as a source region and a drain region, a channel formation region 704 sandwiched between the two impurity regions 703, and two LDD (lightly doped drain) regions 710 sandwiched between the impurity regions 703 and the channel formation region 704. The n-channel TFT 701 further includes a gate insulating film 706 covering the island-like semiconductor film 705, a gate electrode 707, and two sidewalls 708 and 709 made from insulating films.

Although the gate electrode 707 includes two conductive films 707a and 707b in this embodiment, the present invention is not limited to this configuration. The gate electrode 707 may include a single-layer conductive film or two or more layer conductive films. The gate electrode 707 overlaps the channel formation region 704 of the island-like semiconductor film 705 with the gate insulating film 706 therebetween. The sidewalls 708 and 709 overlap the two LDD regions 710 of the island-like semiconductor film 705 with the gate insulating layer 706 therebetween.

For example, the sidewalls 708 can be formed by etching a silicon oxide film with a thickness of 100 nm whereas the sidewalls 709 can be formed by etching an LTO film (a low temperature oxide film) with a thickness of 200 nm. In this embodiment, the silicon oxide film used for the sidewalls 708 is formed by a plasma CVD method and the LTO film used for the sidewalls 709 is formed by a low pressure CVD method.

Note that although the silicon oxide film may contain nitrogen, the number of nitrogen atoms is to be set lower than that of oxygen atoms.

After doping an n-type impurity to the island-like semiconductor film 705 using the gate electrode 707 as a mask, the sidewalls 708 and 709 are formed, and an n-type impurity element is doped to the island-like semiconductor film 705 utilizing the sidewalls 708 and 709 as masks, so that the impurity regions 703 and the LDD regions 710 can be formed separately.

The p-channel TFT 702 has almost the same configuration as the n-channel TFT 701; however, only a structure of an island-like semiconductor film 711 of the p-channel TFT 702 is different. The island-like semiconductor film 711 does not have an LDD region, but includes two impurity regions 712 and a channel formation region 713 sandwiched between the impurity regions. The impurity regions 712 are doped with a p-type impurity. Although FIG. 12A illustrates an example in which the p-channel TFT 702 does not have an LDD region, the present invention is not limited to this configuration. The p-channel TFT 702 may include an LDD region.

Figure 12B:
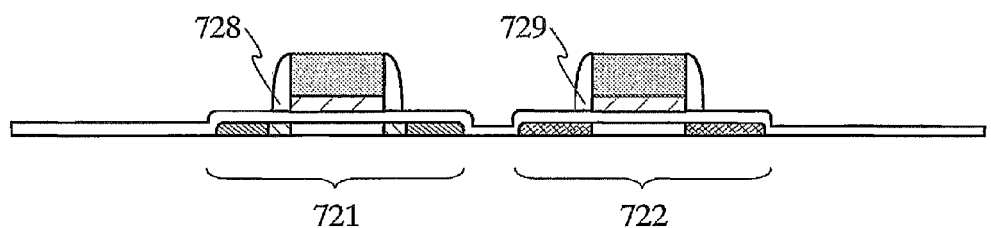

FIG. 12B shows a case where each TFT shown in FIG. 12A has one pair of sidewalls. An n-channel TFT 721 and a p-channel TFT 722 as shown in FIG. 12B each include the pairs of sidewalls 728 and 729, respectively. The sidewalls 728 and 729 can, for example, be made by etching a silicon oxide film with a thickness of 100 nm. In this embodiment, the silicon oxide film used for the sidewall 728 and 729 are formed by a plasma CVD method. The silicon oxide film may contain nitrogen; however, the number of nitrogen atoms is to be set lower than that of oxygen atoms.

Figure 12C:
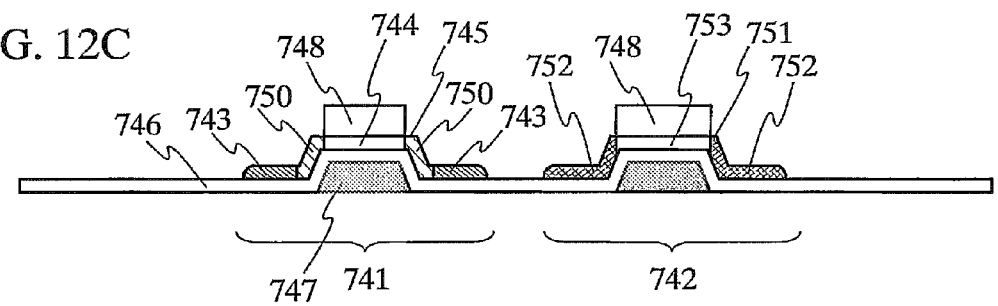

FIG. 12C shows a structure of bottom-gate TFTs. Reference numeral 741 denotes an n-channel TFT; and 742, a p-channel TFT. The n-channel TFT 741 will be explained in detail as an example.

In FIG. 12C, the n-channel TFT 741 includes an island-like semiconductor film 745. The island-like semiconductor film 745 includes two impurity regions 743 used as a source region and a drain region, a channel formation region 744 sandwiched between the impurity regions 743, and two LDD (lightly doped drain) regions 750 sandwiched between the two impurity regions 743 and the channel formation region 744. The n-channel TFT 741 further includes a gate insulating film 746, a gate electrode 747 and a protective film 748 which is made from an insulating film.

The gate electrode 747 overlaps the channel formation region 744 of the island-like semiconductor film 745 with the gate insulating film 746 therebetween. The gate insulating film 746 is formed after forming the gate electrode 747 and the island-like semiconductor film 745 is formed after forming the gate insulating film 746. The protective film 748 overlaps the gate insulating film 746 with the channel formation region 744 therebetween.

The channel protective film 748, for example, can be formed by etching a silicon oxide film with a thickness of 100 nm. In this embodiment, the silicon oxide film is formed by a plasma CVD method as the channel protective film 748. Note that the silicon oxide film may contain nitrogen; however, the number of nitrogen atoms is to be set lower than that of oxygen atoms.

After doping an n-type impurity to the island-like semiconductor film 745 utilizing a mask made from a resist, the channel protective film 748 is formed, and an n-type impurity is doped to the island-like semiconductor film 745 by utilizing the channel protective film 748 as a mask, so that the impurity regions 743 and the LDD regions 750 can be formed separately.

Although the p-channel TFT 742 has almost the same structure as the n-channel TFT 741, only the structure of the island-like semiconductor film 751 of the p-channel TFT 742 is different. The island-like semiconductor film 751 does not include an LDD region, but includes two impurity regions 752 and a channel formation region 753 sandwiched between the two impurity regions 752. The impurity regions 752 are doped with a p-type impurity. Although FIG. 12C shows the example in which the p-channel TFT 742 does not have an LDD region, the present invention is not limited to the structure. The p-channel TFT 742 may include an LDD region. In addition, the n-channel TFT 741 does not necessarily include an LDD region.

This embodiment can be combined freely with at least one of Embodiment Mode, and Embodiments 1 to 2.

Embodiment 4

In this embodiment, a method for manufacturing plural semiconductor devices such as ID chips with the use of a large size substrate will be described.

Figure 13A:
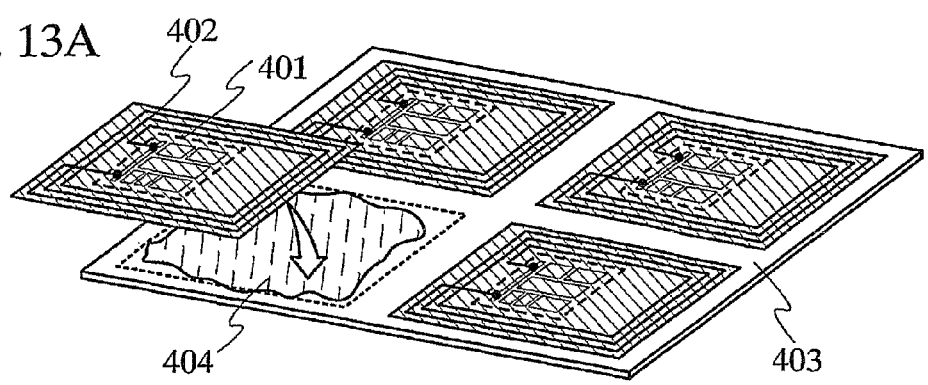
FIGS. 13A to 13D each show a method of forming a plurality of integrated circuits from a large substrate, which are each to be used as an ID chip according to one aspect of the present invention.

An integrated circuit 401 and an antenna 402 are formed over a heat resistant substrate. Thereafter, the integrated circuit 401 and the antenna 402 are both separated from the heat resistant substrate and attached to a substrate 403, which has been separately prepared, with an adhesive agent 404 as shown in FIG. 13A. Although FIG. 13A shows a mode in which a set of the integrated circuit 401 and the antenna 402 is attached to the substrate 403, the present invention is not limited to this configuration. Alternatively, a plurality of sets of the integrated circuit 401 and the antenna 402, which are connected to each other, may be separated from the heat resistant substrate and attached onto the substrate 403 at the same time.

Figure 13B:
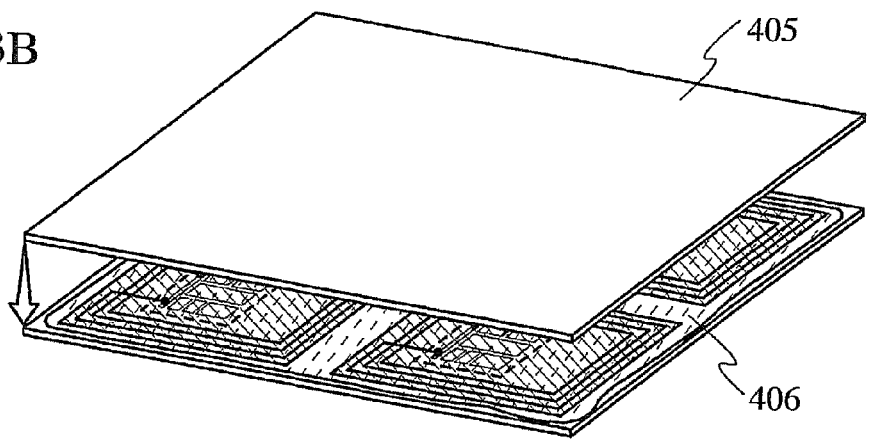
Figure 13C:
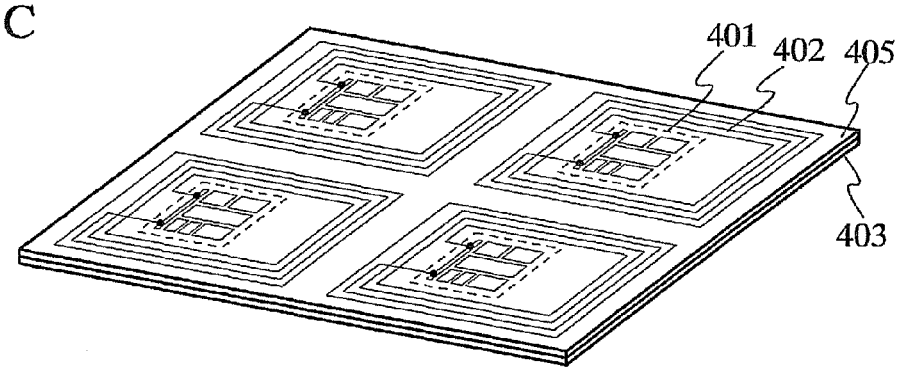

As shown in FIG. 13B, a cover material 405 is attached to the substrate 403 such that the integrated circuits 401 and the antennas 402 are sandwiched therebetween. At this time, an adhesive agent 406 is applied over the substrate 403 so as to cover the integrated circuit 401 and the antenna 402. By attaching the cover material 405 to the substrate 403, the state as shown in FIG. 13C is obtained. Note that, in order to clearly show the positions of the integrated circuit 401 and the antenna 402, FIG. 13C illustrates the integrated circuit 401 and the antenna 402 such that they are seen through the cover material 405.

Figure 13D:
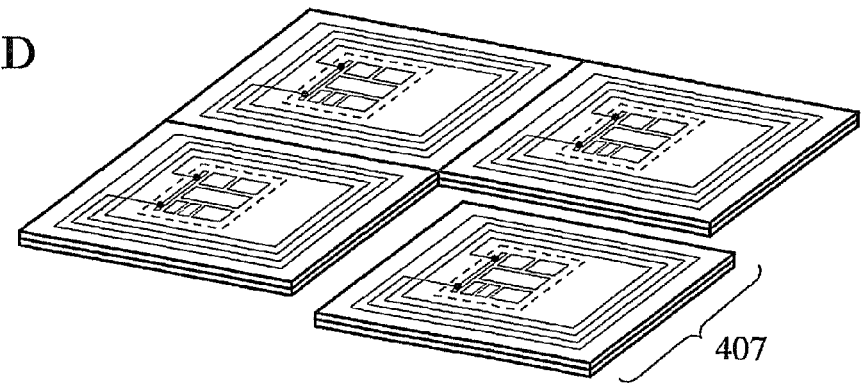

As shown in FIG. 13D, a set of the integrated circuit 401 and the antenna 402 are separated from other sets of the integrated circuits 401 and the antennas 402 by dicing or scribing, thereby completing an ID chip or an IC card 407.

Note that the ID chip using a glass substrate can be referred to as an IDG chip (identification glass chip) whereas the ID chip using a flexible substrate can be referred to as an IDF chip (identification flexible ship).

This embodiment can be combined freely with at least one of Embodiment Mode, and Embodiment 1 to 3.

Embodiment 5

Figure 14A:
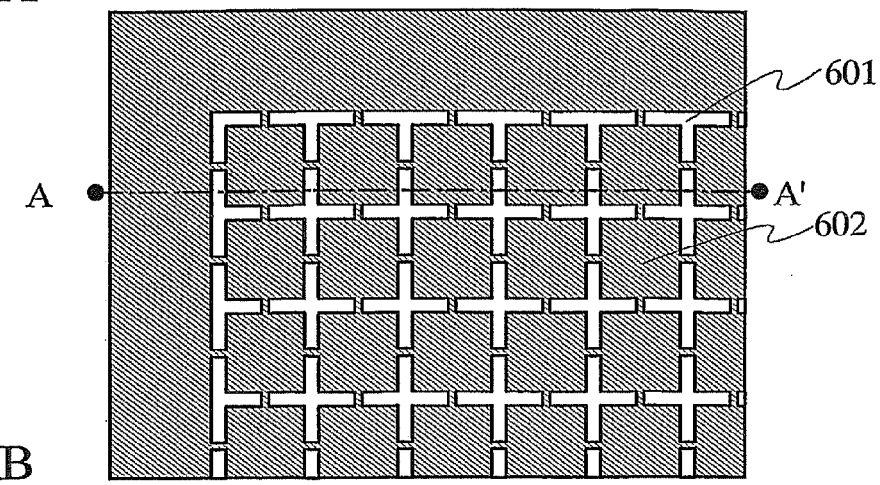
FIGS. 14A to 14D each show a shape of a groove to be formed when a plurality of integrated circuits formed over one substrate are separated.
Figure 14B:
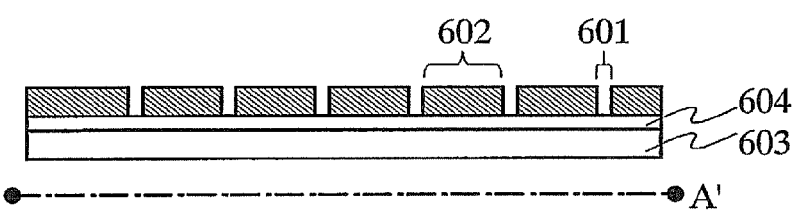

Embodiment 5 describes a shape of a groove to be formed when separating a plurality of integrated circuits formed on one substrate. FIG. 14A is a top view of a substrate 603 over which a groove 601 is formed. FIG. 14B is a cross-sectional view of A-A' from FIG. 14A.

An integrated circuit 602 is formed over a separation layer 604 which is formed on the substrate 603. The groove 601 is formed between thin film integrated circuits 602 and formed deep enough to expose the separation layer 604. In this embodiment, the plurality of thin film integrated circuits 602 are not completely but partially isolated by grooves 601.

Figure 14C:
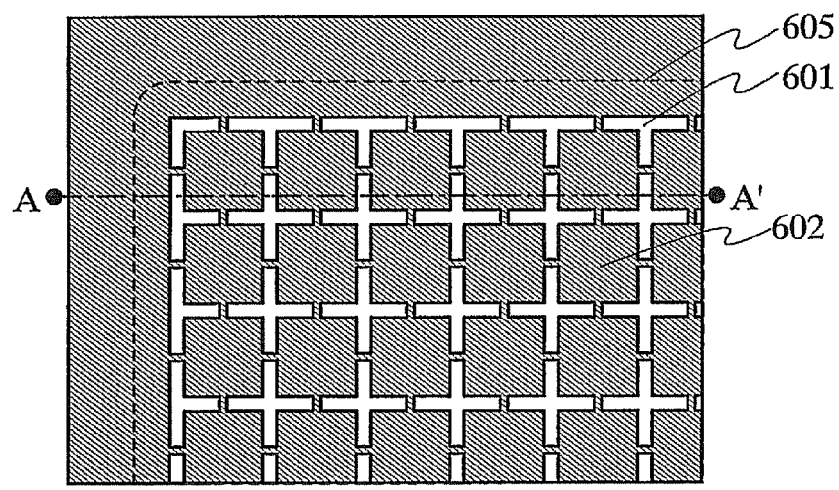
Figure 14D:
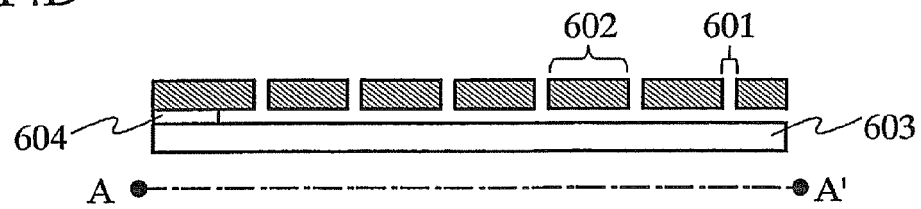

Next, FIGS. 14C and 14D each show a mode where an etching gas is flown into the groove 601 shown in FIGS. 14A and 14B to remove the separation layer 604 by etching. FIG. 14C corresponds to a top view of the substrate 603 on which the groove 601 is formed. FIG. 14D corresponds to a cross-sectional view of A-A' from FIG. 14C. It is assumed that the separation layer 604 is etched from the groove 601 to a region denoted by a broken line 605. The plurality of thin film integrated circuits 602 are not completely but partially isolated by grooves 601 and are partially connected to each other as shown in FIGS. 14C and 14D. Therefore, it is possible to prevent each thin film integrated circuit 602 from moving as the support is lost after etching the separation layer 604.

After the mode shown in FIGS. 14C and 14D is formed, integrated circuits 602 are separated from the substrate 603 by using a tape, a substrate or the like attached with an adhesive agent, which is prepared separately. The plurality of thin film integrated circuits 602 which have been separated from the substrate 603 are attached onto another substrate which has been prepared separately, before or after being sectioned from each other.

This embodiment describes an example of a manufacturing method of a semiconductor device such as an ID chip. A manufacturing method of an ID chip according to the present invention is not limited to the structure described in this embodiment.

This embodiment can be freely combined with at least one of Embodiment, and Embodiments 1 to 4.

Embodiment 6

When a semiconductor device such as an ID chip of the present invention is formed using a flexible substrate, the ID chip is suitable for being attached to an object having flexibility or a curved face. When a memory such as a ROM that cannot be rewritten is formed inside of an integrated circuit included in the ID chip of the present invention, forgery of the objects attached with the ID chip can be prevented. For example, the application of the ID chip of the present invention to foods in which their commodity values largely depend on production areas and producers is advantageous for inhibiting mislabeling of the production areas and producers at a low cost.

Specifically, the ID chip of, the present invention can be used as the ID chip attached to tags having information about objects such as luggage tags, price tags and name tags. Also, the ID chip of the present invention itself may be utilized as such tags. For example, the ID chip may be attached to certificates corresponding to documents that prove facts such as family registers, certificates of residence, passports, licenses, identification cards, member cards, surveyor certificates, credit cards, cash cards, prepaid cards, consultation cards and commuter passes. In addition, for instance, the ID chip may be attached to portfolios corresponding to certificates that show property rights in private law such as bills, checks, carriage notes, cargo certificates, warehouse certificates, stock certificates, bond certificates, gift certificates and deeds of mortgage.

Figure 15A:
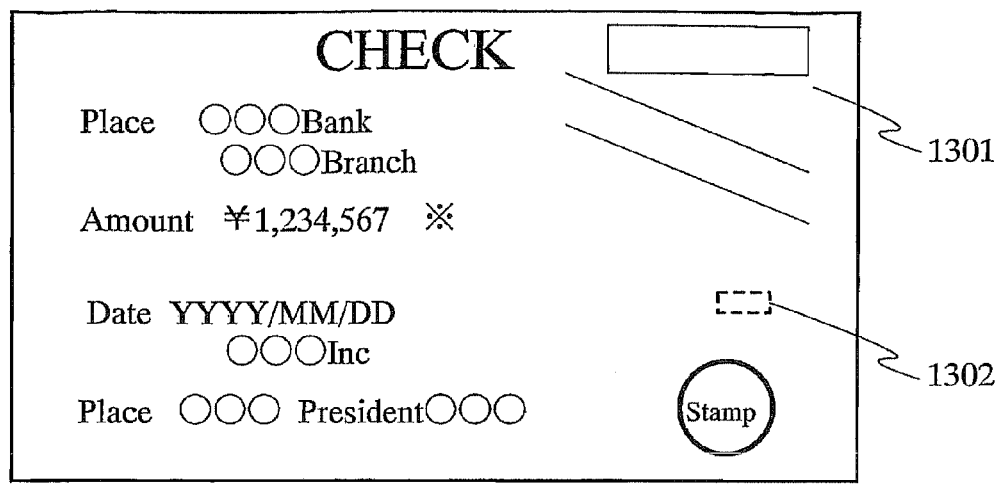
FIGS. 15A to 15C each show how an ID chip is used according to one aspect of the present invention.

FIG. 15A shows an example of a check 1301 attached with an ID chip 1302 of the present invention. Although the ID chip 1302 is attached to the inside of the check 1301 in FIG. 15A, it may be provided to be exposed on the surface of the check. An ID chip of the present invention in the case of using a glass substrate has an advantageous effect that the ID chip is not broken by stress if it is attached to the flexible check 1301.

Figure 15B:
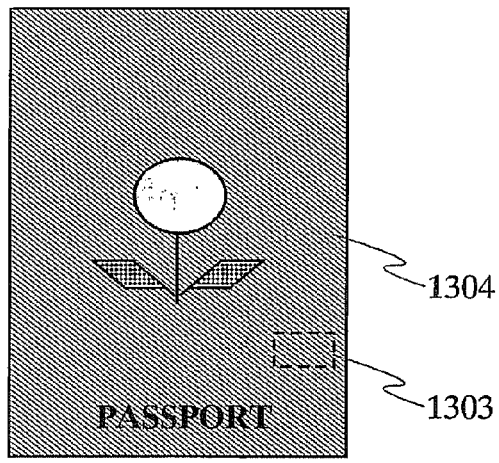

FIG. 15B shows an example of a passport 1304 attached with an ID chip 1303 of the present invention. Although the ID chip 1303 is attached to the front page of the passport 1304 in FIG. 15, it may be attached to another page of the passport. An ID chip of the present invention in the case of using a glass substrate has an advantageous effect that the ID chip is not broken by stress if it is attached to the flexible passport 1304.

Figure 15C:

FIG. 15C shows an example of a gift certificate 1306 attached with an ID chip 1305 of the present invention. The ID chip 1305 may be attached to either the inside of the gift certificate 1306 or on the surface thereof to be exposed. An ID chip of the present invention in the case of using a glass substrate has an advantageous effect that the ID chip is not broken by stress if it is attached to the flexible gift certificate 1306.

The ID chip using an integrated circuit with TFTs is inexpensive and thin, and hence, the ID chip of the present invention is suitable for ID chips that are eventually discarded by consumers. In particular, when the ID chip is applied to products in which difference in price in units of several yen to several tens of yen significantly affects sales, a packing material having the inexpensive and thin ID chip of the present invention is very advantageous. The packing material is equivalent to a support medium, such as a plastic wrap, a plastic bottle, a tray and a capsule, which can be shaped or has been shaped to wrap up an object.

Figure 16A:
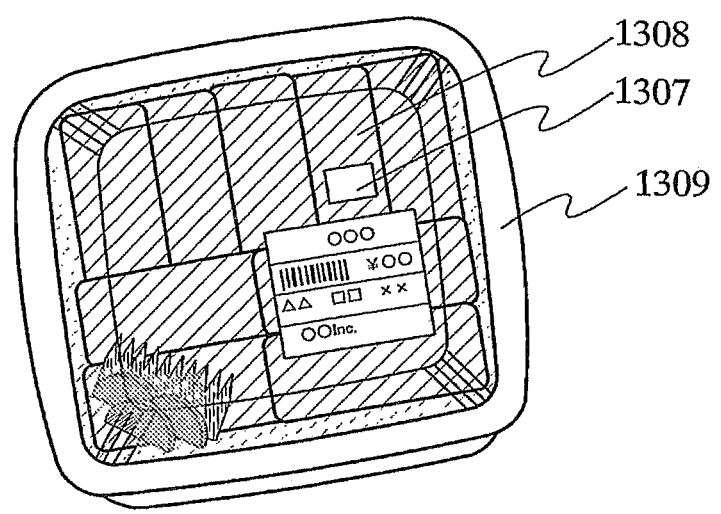
FIGS. 16A and 16B each show how an ID chip is used according to one aspect of the present invention.

A state of packing a boxed meal 1309 for sale by a packing material 1308, which is attached with an ID chip 1307 of the present invention, is shown in FIG. 16A. By storing the price and the like of the product in an ID chip 1307, the price for the boxed meal 1309 can be accounted for by a register having functions of a reader/writer. Further, management of inventory or expiration dates of products can be easily done.

For example, the ID chips of the present invention may be attached to a product label so that the distribution process of the product is managed.

Figure 16B:
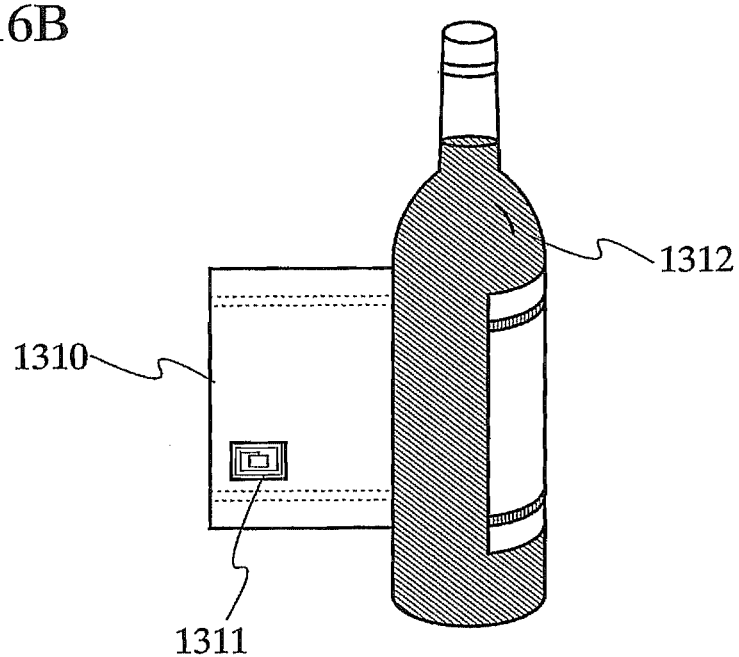

As shown in FIG. 16B, an ID chip 1311 of the present invention is attached to a support medium such as a product label 1310 with its rear face having viscosity. The label 1310 attached with the ID chip 1311 is pasted to a product 1312. Identification information about the product 1312 can be read wirelessly from the ID chip 1311 attached to the label 1310. Accordingly, management of the distribution process of the product becomes easier by the ID chip 1311. An ID chip of the present invention in the case of using a glass substrate has an advantageous effect that the ID chip is not broken by stress if it is attached to the flexible label 1310. Therefore, the label 1310 using the ID chip of the present invention is suitable for being attached onto an object having a curved surface.

In the case of using a nonvolatile memory, which can write information therein, as a memory of an integrated circuit included in the ID chip 1311, information of the distribution process of the product 1312 can be stored. Stored information of the process in the production stage of products can allow wholesalers, retailers and consumers to grasp information about production areas, producers, dates of manufacture, processing methods and the like easily.

This embodiment can be freely combined with at least one of Embodiment, and Embodiments 1 to 5.

The present application is based on Japanese Priority Application No. 2004-070788 filed on Mar. 12, 2004 with the Japan Patent Office, the entire contents of which are hereby incorporated by reference.

EXPLANATION OF REFERENCE

100: integrated circuit, 101: antenna, 102: substrate, 103: cover material:, 104: TFT, 105: conducting wire, 106: insulating layer, 107: broken line, 108: fine particles, 109: isolation insulating film, 110: insulator, 111: interlayer insulating film, 201: conductor, 202: conductor, 203: conductor, 204: conductor, 205: protective film, 301: isolation insulating film, 302: insulating layer, 303: insulating film, 304: isolation insulating film, 401: integrated circuit, 402: antenna, 403: substrate, 404: adhesive agent, 405: cover material, 406: adhesive agent, 407: ID chip, 500: substrate, 501: separation layer, 502: base film, 503: semiconductor film, 504: semiconductor film, 505: semiconductor film, 506: semiconductor film, 507: gate insulating film, 510: gate electrode, 511: gate electrode, 512: gate electrode, 513: resist, 514: resist, 516: low concentration impurity region, 517: low concentration impurity region, 518: resist, 519: high concentration impurity region, 520: insulating film, 522: sidewall, 523: sidewall, 524: sidewall, 525: resist, 527: high concentration impurity region, 528: high concentration impurity region, 529: TFT, 530: TFT, 531: TFI, 533: interlayer insulating film, 534: interlayer insulating film, 535: wiring, 536: wiring, 537: wiring, 538: wiring, 539: wiring, 540: interlayer insulating film, 541: antenna, 542: isolation insulating film, 543: protective layer, 546: groove, 547: adhesive agent, 548: substrate, 549: insulating layer, 550: insulator, 551: fine particles, 552: adhesive agent, 553: cover material, 570: substrate, 571: TFT, 572: TFT, 573: TFT, 574: base film, 575: cover material, 601: groove, 602: integrated circuit, 603: substrate, 604: separation layer, 605: broken line, 701: n-channel TFT, 702: p-channel TFT, 703: impurity region, 704: channel formation region, 705: semiconductor film, 706: gate insulating film, 707: gate electrode, 707*a*: conductive film, 707*b*: conductive film, 708: sidewall, 709: sidewall, 710: LDD region, 711: semiconductor film, 712: impurity region, 713: channel formation region, 721: n-channel TFT, 722: p-channel TFT, 728: sidewall, 729: sidewall, 741: n-channel TFT, 742: p-channel TFT, 743: impurity region, 744: channel formation region, 745: semiconductor film, 746: gate insulating film, 747: gate electrode, 748: channel protective film, 750: LDD region, 751: semiconductor film, 752: impurity region, 753: channel formation region, 900: antenna, 901: integrated circuit, 903: capacitor, 904: modulation circuit, 905: rectification circuit, 906: microprocessor, 907: memory, 908: switch, 909: demodulation circuit, 1301: check, 1302: ID chip, 1303: ID chip, 1304: passport, 1305: ID chip, 1306: gift certificate, 1307: ID chip, 1308: packing material, 1309: boxed meal, 1310: label, 1311: ID chip, 1312: product, 1401: TFT, 1402: semiconductor film, 1403: gate insulating film, 1404: gate electrode, 1405: interlayer insulating film, 1406: interlayer insulating film, 1407: wiring, 1408: antenna, 1409: isolation insulating film, 1410: insulating layer, 1411: TFT, 1412: semiconductor film, 1413: gate insulating film, 1414: gate electrode,1418: antenna, 1420: insulating layer, 1701: interlayer insulating film, 1702: insulating film, 1703: insulating film, 1704: interlayer insulating film, 1705: antenna, 1706: isolation insulating film, 1707: insulating layer,

What is claimed is:

1. A semiconductor device comprising:
a substrate;
a first metal layer over the substrate;
an insulating layer over the first metal layer;
a resin, over the insulating layer; and
a second metal layer over the resin,
wherein fine particles of a soft magnetic material are included in the resin,
wherein the second metal layer is electrically connected to the first metal layer through a contact hole of the insulating layer and the resin, and
wherein the first metal layer is electrically connected to a semiconductor.

2. A semiconductor device according to claim 1,
wherein the substrate is a glass substrate.

3. A semiconductor device according to claim 1,
wherein a thin film transistor comprises the semiconductor.

4. The semiconductor device according to claim 1,
wherein the soft magnetic material is Fe; Co; Ni; an alloy including at least one of Fe, Co, and Ni; $3Y_2O_3 \cdot 5Fe_2O_3$ (YIG); $Fe_2O_3$; Fe—Si—Al alloy; Fe—Cr alloy; FeP alloy; a permalloy in which Ni or Ni—Fe alloy is added with at least one of Mo, Cu, Cr, and Nb; or a soft ferrite.

5. The semiconductor device according to claim 1, further comprising:
a second insulating layer over the second metal layer.

6. A semiconductor device comprising:
a substrate;
a metal layer over the substrate;
an insulating layer over the metal layer;
a resin, over the insulating layer; and
an antenna over the resin,
wherein fine particles of a soft magnetic material are included in the resin,
wherein the antenna is electrically connected to the metal layer through a contact hole of the insulating layer and the resin, and
wherein the metal layer is electrically connected to a semiconductor.

7. A semiconductor device according to claim 6,
wherein the substrate is a glass substrate.

8. A semiconductor device according to claim 6,
wherein a thin film transistor comprises the semiconductor.

9. The semiconductor device according to claim 6,
wherein the soft magnetic material is Fe; Co; Ni; an alloy including at least one of Fe, Co, and Ni; $3Y_2O_3 \cdot 5Fe_2O_3$ (YIG); $Fe_2O_3$; Fe—Si—Al alloy; Fe—Cr alloy; FeP alloy; a permalloy in which Ni or Ni—Fe alloy is added with at least one of Mo, Cu, Cr, and Nb; or a soft ferrite.

10. The semiconductor device according to claim 6, further comprising:
a second insulating layer over the antenna.

11. A semiconductor device comprising:
a substrate;
a first metal layer and over the substrate;
an insulating layer over the first metal layer;
a first resin over the insulating layer;
a second metal layer over the first resin; and
a second resin over the second metal layer,
wherein first fine particles of a first soft magnetic material are included in the first resin,
wherein second fine particles of a second soft magnetic material are included in the second resin,
wherein the second metal layer is electrically connected to the first metal layer through a contact hole of the insulating layer and the first resin, and
wherein the first metal layer is electrically connected to a semiconductor.

12. A semiconductor device according to claim 11,
wherein the substrate is a glass substrate.

13. A semiconductor device according to claim 11,
wherein a thin film transistor comprises the semiconductor.

14. The semiconductor device according to claim 11,
wherein each of the first soft magnetic material and the second soft magnetic material is Fe; Co; Ni; an alloy including at least one of Fe, Co, and Ni; $3Y_2O_3 \cdot 5Fe_2O_3$ (YIG); $Fe_2O_3$; Fe—Si—Al alloy; Fe—Cr alloy; FeP alloy; a permalloy in which Ni or Ni—Fe alloy is added with at least one of Mo, Cu, Cr, and Nb; or a soft ferrite.

15. The semiconductor device according to claim 11,
wherein the first soft magnetic material is a same material as the second soft magnetic material.

16. The semiconductor device according to claim 11, further comprising:
a second insulating layer over the second metal layer.

* * * * *

UNITED STATES PATENT AND TRADEMARK OFFICE
CERTIFICATE OF CORRECTION

PATENT NO. : 8,546,912 B2  Page 1 of 1
APPLICATION NO. : 13/440157
DATED : October 1, 2013
INVENTOR(S) : Shunpei Yamazaki et al.

It is certified that error appears in the above-identified patent and that said Letters Patent is hereby corrected as shown below:

In the Specification

Column 10, line 4, "1" should be --TFT--;

Column 10, line 64, "asking" should be --ashing--;

Column 11, line 10, "asking" should be --ashing--;

Column 12, line 38, second occurrence, "polyimide" should be --polyamide--;

Column 15, line 67, "(PET)" should be --(PBT)--;

Column 20, line 21, "framing" should be --forming--;

Column 24, line 41, "of, the" should be --of the--;

In the Claims

Claim 1, column 26, line 57, "resin, over" should be --resin over--;

Claim 6, column 27, line 16, "resin, over" should be --resin over--;

Claim 11, column 28, line 3, "layer and over" should be --layer over--.

Signed and Sealed this
Eighteenth Day of February, 2014

Michelle K. Lee
*Deputy Director of the United States Patent and Trademark Office*